United States Patent
Sunami et al.

(10) Patent No.: US 6,642,574 B2
(45) Date of Patent: Nov. 4, 2003

(54) SEMICONDUCTOR MEMORY DEVICE AND MANUFACTURING METHOD THEREOF

(75) Inventors: Hideo Sunami, Nishitama-gun (JP); Kiyoo Itoh, Higashikurume (JP); Toshikazu Shimada, Kokubunji (JP); Kazuo Nakazato, Cambridge (GB); Hiroshi Mizuta, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/727,497

(22) Filed: Dec. 4, 2000

(65) Prior Publication Data

US 2001/0002054 A1 May 31, 2001

Related U.S. Application Data

(63) Continuation of application No. 09/166,858, filed on Oct. 6, 1998, now Pat. No. 6,169,308, which is a continuation-in-part of application No. 09/095,058, filed on Jun. 10, 1998, now Pat. No. 6,060,723, and a continuation-in-part of application No. 08/958,845, filed on Oct. 28, 1997, now Pat. No. 5,952,692.

(30) Foreign Application Priority Data

Oct. 7, 1997 (JP) .............................................. 9-274090

(51) Int. Cl.[7] .............................................. H01L 29/72
(52) U.S. Cl. ........................ 257/321; 257/324; 257/411
(58) Field of Search .................................. 257/321, 324, 257/411, 316, 325, 410, 635, 636, 637, 649

(56) References Cited

U.S. PATENT DOCUMENTS

| | | | |
|---|---|---|---|
| 3,878,549 A | 4/1975 | Yamazaki et al. | |
| 4,630,089 A | * 12/1986 | Sasaki et al. | 257/321 |
| 4,669,062 A | 5/1987 | Nakano | 365/174 |
| 4,692,997 A | 9/1987 | Calviello | |
| 5,057,888 A | 10/1991 | Fazan et al. | 357/23.6 |
| 5,093,699 A | 3/1992 | Weichold et al. | |
| 5,194,749 A | 3/1993 | Meguro et al. | 257/69 |
| 5,198,683 A | 3/1993 | Sivan | 257/67 |
| 5,216,262 A | 6/1993 | Tsu | 257/411 |
| 5,286,994 A | 2/1994 | Ozawa et al. | 257/324 |

(List continued on next page.)

FOREIGN PATENT DOCUMENTS

| | | |
|---|---|---|
| EP | 0145403 | 6/1985 |
| EP | 0202755 | 11/1986 |
| EP | 0249204 | 12/1987 |

(List continued on next page.)

OTHER PUBLICATIONS

Patent Abstracts of Japan, vol. 97, No. 3, Mar. 31, 1997 & JP 08 306 889 A (Toshiba Corp), Nov. 22, 1996.

(List continued on next page.)

*Primary Examiner*—Edward Wojciechowicz
(74) *Attorney, Agent, or Firm*—Kenyon & Kenyon

(57) ABSTRACT

A high speed/large capacity DRAM (Dynamic Random Access Memory) is generally refreshed each 0.1 sec because it loses information stored therein due to a leakage current. The DRAM also loses information stored therein upon cutoff of a power source. Meanwhile, a nonvolatile ROM (Read-only Memory) cannot be configured as a high speed/large capacity memory.

A semiconductor memory device of the present invention realizes nonvolatile characteristic by shielding a drain functioning as a memory node from a leakage current by a tunnel insulator, and also realizes stable and high speed operation by adding a transistor for reading to a memory cell.

35 Claims, 17 Drawing Sheets

U.S. PATENT DOCUMENTS

| | | | |
|---|---|---|---|
| 5,319,229 A | | 6/1994 | Shimoji et al. ............. 257/324 |
| 5,432,362 A | | 7/1995 | Lippens et al. |
| 5,557,566 A | * | 9/1996 | Ochii ......................... 257/321 |
| 5,604,357 A | | 2/1997 | Hori ........................... 257/324 |
| 5,606,177 A | | 2/1997 | Wallace et al. |
| 5,629,231 A | | 5/1997 | Kiehl |
| 5,714,766 A | | 2/1998 | Chen et al. ................... 257/17 |
| 5,834,851 A | | 11/1998 | Ikeda et al. ................. 257/903 |
| 5,864,158 A | | 1/1999 | Liu et al. .................... 257/330 |

FOREIGN PATENT DOCUMENTS

| | | |
|---|---|---|
| EP | 0 499 824 | 8/1992 |
| EP | 0642173 | 8/1994 |
| EP | 0649174 | 4/1995 |
| EP | 0700093 | 3/1996 |
| EP | 0750353 | 12/1996 |
| FR | 7138633 | 10/1971 |
| GB | 9415340 | 7/1994 |
| GB | 2295488 | 5/1996 |
| JP | 61-201470 | 9/1986 |
| JP | 08264807 | 2/1988 |
| JP | 63-034975 | 2/1988 |
| JP | 06302623 | 10/1994 |
| JP | 08097305 | 4/1996 |
| WO | WO86/06540 | 11/1986 |
| WO | WO96/26544 | 8/1996 |

OTHER PUBLICATIONS

Anonymous, "Superlattice Tailoring of Obtain Devices with High Saturation Velocity", IBM Technical Disclosure Bulletin, vol. 29, No. 7, Dec. 1986, New York, pp. 2931–2932.

Austing et al., "Single Electron Tunneling in Sub–Micron AIGaAs/GaAs Double Barrier Transistor Structures", Solid State Electronics, vol. 40, No. 1/08, Jan. 1, 1996, pp. 237–240.

Ahmed et al., "Single–Electron Devices", Microelectronic Engineering, vol. 32, No. 1/4, Sep. 1996, pp. 297–315.

Lour, "Fabrication of Voltage–Controlled Strained–Layer Quantum Well Three–Terminal Switching Device", Solid State Electronics, vol. 38, No. 3, Mar. 1, 1995, pp. 557–560.

Wei et al., "Controlled Growth of $SiO_2$ Tunnel Barrier and Crystalline Si Quantum Wells for Si Resonant Tunneling Diodes", Journal of Applied Physics, vol. 81, No. 9, May 1997, pp. 6415–6424.

Austing et al., "A New Design for Submicron Double–Barrier Resonant Tunnelling Transistors", Semiconductor Science and Technology, vol. 11, No. 3, Mar. 1, 1996, pp. 388–391.

Capasso et al., "Quantum Functional Devices: Resonant–Tunneling Transistors, Circuits with Reduced Complexity, and Multiple–Valued Logic", IEEE Transactions on Electron Devices, vol. 36, No. 10, Oct. 1, 1989, pp. 2065–2082.

Nakazato et al.,"Enhancement of Coulomb Blockade in Semiconductor Tunnel Junctions", Applied Physics Letters, vol. 66, No. 23, Jun. 5, 1995, pp. 3170–3172.

Nakazato et al., "Single–Electron Memory", Journal of Applied Physics, vol. 75, No. 10, May 15, 1994, pp. 5123–5134.

Uemura et al., "Large Enhancement of Interband Tunneling Current Densities of Over $10^5$ $A/cm^2$ in $In_{0.53}Ga_{0.47}As$–Based Surface Tunnel Transistors", IEEE Electron Device Letters, vol. 18, No. 5, May 1997, pp. 225–227.

Austing et al., "GaAs/AIGaAs/InGaAs Vertical Triple Barrier Single Electron Transistors", Japanese Journal of Applied Physics, vol. 36, No. 3B, Part 1, Mar. 1997, pp. 1667–1671.

Nakagawa et al., "Thermally Stimulated Resonant Current in AIGaAs/GaAs Triple Barrier Diodes", Applied Physics Letters, Aug. 10, 1987, vol. 51, No. 6, pp. 445–447.

Moslehi et al, "Thermal Nitridation of Si and $SiO_2$ for VLSI", IEEE Transactions on Electron Devices, vol. ED–32, No. 2, Feb. 1985, pp. 106–123.

Liu et al., "Self–Limiting Oxidation for Fabricating Sub–5 nm Silicon Nanowires", Appl. Phys. Lett. 64 (11), Mar. 14, 1994, pp. 1383–1385.

Fukuda et al., "Fabrication of Silicon Nanopillars Containing Polycrystalline Silicon/Insulator Multilayer Structures", Appl. Phys. Lett. 70(3), Jan. 20, 1997, pp. 333–335.

Hanafi, et al., "Fast and Long Retention–Time Nano–Crystal Memory", IEEE Transactions on Electron Devices, vol. 43, No. 9, Sep. 1996, pp. 1553–1558.

Bar–Sadeh et al., "Single–Electron Tunneling Effects in Granular Metal Films", Physical Review B, vol. 50, No. 12, Sep. 15, 1994, pp. 8961–8964.

Yano et al., "Room–Temperature Single–Electron Memory", IEEE Transactions on Electron Devices, vol. 41, No. 9, Sep. 1994, pp. 1628–1638.

Yano et al., "Single–Electron–Memory Integrated Circuit for Giga–to–Tera Bit Storage", ISSCC96/Session 16/Technology Directions: Memory/Paper FP 16.4.

Tiwari et al., "A Silicon Nanocrystals Based Memory", Appl. Phys. Lett. 68, (10), Mar. 4, 1996, pp. 1377–1379.

DiMaria et al., "Electrically–Alterable Memory Using A Dual Electron Injector Structure", IEEE Electron Device Letters, vol. EDL–1, No. 9, Sep. 1990, pp. 179–181.

* cited by examiner

S₁–S₄: SENSE LINE
C₁–C₃: CONTROL LINE
D₁–D₆: DATA LINE
RW₁, RW₂: 1ST WORD LINE
WW₁, WW₂: 2ND WORD LINE

S₁, S₂ : SENSE LINE
D₁, D₂ : DATA LINE
N₁, N₂ : MEMORY NODE
RW₁, RW₂ : 1ST WORD LINE
WW₁, WW₂ : 2ND WORD LINE

SEMICONDUCTOR MEMORY DEVICE AND MANUFACTURING METHOD THEREOF

CROSS-REFERENCE TO RELATED APPLICATION

This is a continuation of U.S. patent application Ser. No. 09/166,858 filed Oct. 6, 1998, now U.S. Pat. No. 6,169,308 which is a continuation-in-part of U.S. patent application Ser. No. 09/095,058, filed Jun. 10, 1998, now U.S. Pat. No. 6,060,723 and is a continuation-in-part of U.S. patent application Ser. No. 08/958,845, filed Oct. 28, 1997 now U.S. Pat. No. 5,952,692.

BACKGROUND OF THE INVENTION

Field of the Invention

The present invention relates to a semiconductor memory device formed on a semiconductor substrate and a manufacturing method thereof.

Semiconductor memories are broadly classified into RAMs (Random-access Memories) and ROMs (Read-only Memories). Of the semiconductor memories, those used in the largest amounts as work storages for computers are dynamic RAMs (hereinafter, referred to as DRAMs).

In the DRAM, a memory cell for storing information is composed of one storage electric capacitor and a transistor for reading charges stored in the capacitor. Of the RAMs, the DRAM is composed of the minimum number of elements, and therefore, it is suitable for large-scale integration. Accordingly, such semiconductor memories have been produced on a large scale at relatively low costs.

This DRAM loses information stored therein after an elapse of a certain period of time because charges stored in the electric capacitor are canceled by thermal excitation charges generated in the semiconductor substrate or collision ionization charges due to a strong electric field. The thermal excitation charges and collision ionization charges constitute a leakage current. For this reason, the DRAM is refreshed for restoring the charges before the DRAM loses the information stored therein. In general, the refreshment is performed at intervals of about 100 ms. The reason why the semiconductor memory of this type is called the dynamic RAM is due to such an operational mode.

In the DRAM, to avoid the above leakage current, internal noise accompanied by operation, and disturbance caused by α-particles, it is substantially difficult to set the level of the storage electric capacitor at a specific value or less. In other words, there exists the minimum signal charge quantity which is, depending on the integration degree of the memory and the configuration of the memory array, estimated to be equivalent to electrons of about a million pieces for a 16 Mbits DRAM and about a hundred thousand pieces for a 16 Gbits DRAM having an integration degree being 1000 times that of the 16 Mbits DRAM.

In particular, the above leakage current is generated at a pn-junction between the source or drain and the semiconductor substrate. This is because one electrode of the storage electric capacitor is connected to the source or drain of the transistor for reading. Although an actual DRAM product suppresses the collision ionization current due to an electric field by making the pn-junction as fine as possible and making gentle the gradient of an impurity concentration, it is impossible to eliminate the leakage current as is apparent from the electronic principle of the semiconductor.

Another problem of the DRAM is that the memory cell has no amplifying effect because information is stored as a quantity of charges and the charges are read out as they are, and accordingly a signal voltage is generally small and the readout rate becomes low.

The RAM includes a static RAM (SRAM) paired with the DRAM. In general, a memory cell of the SRAM is composed of six transistors, or two resistors and four transistors. These elements constitute flip-flop. The SRAM keeps the storing state insofar as it is applied with a current, and therefore, it does not require refreshment, differently from the DRAM. The SRAM, however, has a size being several times that of the DRAM because the memory cell has a number of composing elements, and accordingly, it is relatively expensive. The SRAM enables high speed operation by an amplifying effect of the memory cell and does not require refreshment, and therefore, it has an advantage in terms of realizing ultra-low power consumption.

Meanwhile, a usual nonvolatile ROM stores charges by allowing a tunnel current to flow in a storage node surrounded by an insulator. The charge quantity is equivalent to electrons of about a hundred thousand pieces. The insulator generally has a thickness of about 10 nm or more for keeping the memory holding time for 10 years or more. The nonvolatile ROM requires a longer write time as compared with the RAM, and therefore, it cannot be used as the RAM. Further, a current is forcibly applied to the insulator by repeated writing operation, so that the insulator is gradually deteriorated and finally it is converted into a conductor layer, which makes it impossible to hold the memory. Accordingly, in an actual nonvolatile ROM, the number of writing operation is limited to a hundred thousand times.

In this way, the DRAM, SRAM, and nonvolatile ROM have advantages and disadvantages, and are used in accordance with manners most suitable therefor, respectively.

SUMMARY OF THE INVENTION

The present invention provides, as described above, a memory having both the features of the usual RAM and nonvolatile memory. The gist of the present invention is to write information in a memory node via a tunnel insulator and to read information from the memory node via a transistor using the memory node as a gate. With this configuration, there can be realized a memory exhibiting an information storing operation similar to that of the usual nonvolatile memory in combination with an amplifying function of a memory cell similar to that of the usual SRAM.

In other words, an object of the present invention is to provide a semiconductor memory device having a good long-term memory holding characteristic in combination with a stable and high speed RAM operation. Another object of the present invention is to provide a method of manufacturing such a semiconductor memory device.

To achieve the above object, a memory cell is composed of, for example, a transistor for writing which is connected to a memory node, and a transistor for reading, which uses the memory node as a gate. This will be described in detail later with reference to preferred embodiments. At this time, a first word line can be connected to the memory node. The transistor for writing can be constituted of a transistor in which a substrate structure having barrier layers, composed of a stack of barrier substrates and barrier layers, is used as the substrate of the transistor and a second word line is used as a gate.

With this configuration, since the memory node is not connected to the silicon substrate, a leakage current does not allow to flow from the silicon substrate into the memory node, differently from the memory cell of the usual DRAM.

Further, since the barrier layers as insulators are present between the memory node and the source connected to a data line of the transistor for writing, it is possible to suppress, differently from the memory cell of the usual DRAM, a sub-threshold current flowing between the source and the drain of the transistor for reading and writing storage charges.

In addition, these leakage current and the sub-threshold current lose the memory of the DRAM. For this reason, as described above, the DRAM is refreshed. In general, the refreshment is repeated at intervals of about 100 ms.

In the structure of the present invention, after the power supply is perfectly cutoff, the word line, data line, sense line and control line are all floated, that is, become 0 V. Accordingly, in the structure of the present invention, since any leakage current is not allowed to flow from the substrate, charges in the memory node can be held by making the barrier layer sufficiently thick or making the threshold voltage of the transistor for writing sufficiently high. The structure of the present invention can be thus used as a nonvolatile semiconductor memory device. To make the threshold voltage sufficiently high, the concentration of an impurity doped in the barrier substrate of the transistor for writing may be made high.

The operational condition to prevent charges of the memory node from being erased during current-carrying to the memory can be achieved by suitably selecting a relationship between a voltage of a non-selection word line and a threshold voltage of a cell writing transistor. This enables an operation similar to that of the usual SRAM.

Depending on the degree of suppressing the leakage current and the sub-threshold current within the above operational condition, the inventive memory can be realized as a semiconductor device having a characteristic changeable between that of the perfect nonvolatile memory and that of the usual DRAM. In the case of no barrier layer, the inventive memory requires the refreshment like the DRAM, and in the case where the barrier layer has a thickness comparable to that of a flash memory which is one kind of the nonvolatile memory, there can be realized a nonvolatile memory. Accordingly, the present invention has a large advantage that a desired function can be obtained by selecting the material of the barrier layer and its thickness, and also selecting the material of the barrier substrate and its impurity concentration.

For example, in the case where the thickness of the barrier layer of the inventive memory is made thin, a sub-threshold current is allowed to flow; however, the magnitude of the sub-threshold current is smaller than that in the usual DRAM because the sub-threshold current can be somewhat suppressed in the inventive memory, and therefore, the inventive memory can act as the usual DRAM in which the time interval of refreshment is made sufficiently longer and thereby a standby power can be reduced. The reduction in standby power enables backup using a battery or the like, and accordingly, the inventive memory can be regarded as a pseudo nonvolatile memory from the viewpoint of the entire configuration including the battery.

On the other hand, an actual large-scale memory can be realized by arranging a plurality of the memory cells in a matrix, and connecting them to each other by the control line, sense line, data line, first word line, second word line, and the like.

The basic structure of one example of a memory device of the present invention has a memory cell, and a data line, word line and a sense line connected to the memory cell.

The memory cell has a memory node for storing charges, a writing element as a path for injecting or discharging charges into or from the memory node, and a reading element for detecting a charge storing state of the memory node. The reading element has a first transistor whose threshold value is changed depending on the charge storing state of the memory node, and the sense line is connected to a source/drain path of the first transistor. The writing element is disposed between the memory node and the data line, and it has a second transistor having a stacked structure of insulators and semiconductor layers and a control electrode formed on the side wall of the stacked structure. Further, the word line is connected to the control electrode.

Here, the first transistor can be formed on the substrate and the second transistor can be formed on the first transistor. That is to say, when the layout of the substrate plane is viewed from top, the configuration of the first transistor and the configuration of the second transistor are partly or entirely overlapped, and accordingly, the chip area can be reduced.

At this time, the first transistor is constituted of a field effect transistor, and a gate of the field effect transistor can serve as the memory node. A second control electrode can be provided on the side wall of the gate electrode via an insulator. In this way, the control electrode can be provided on the side wall of the memory node or the transistor. That is to say, the control electrode can extend along in the direction perpendicular to the substrate plane or along a plane crossing the substrate plane.

According to another example of the present invention, there is provided an apparatus having a MISFET (Metal Insulator Field Effect Transistor), and a stacked structure including insulators and semiconductor regions, which structure is connected to a gate connected to the MISFET. In this example, information is written or erased by injecting or discharging charges into or from the gate via the above stacked structure, and information is read out by means of a sense line connected to a source/drain path of the MISFET. The MISFET is a detecting transistor, and the gate thereof serves as a memory node. The stacked structure connected to the memory node acts as a barrier for controlling injection or discharge of charges into or from the memory node.

DESCRIPTION OF THE PREFERRED EMBODIMENT

Figure 1:
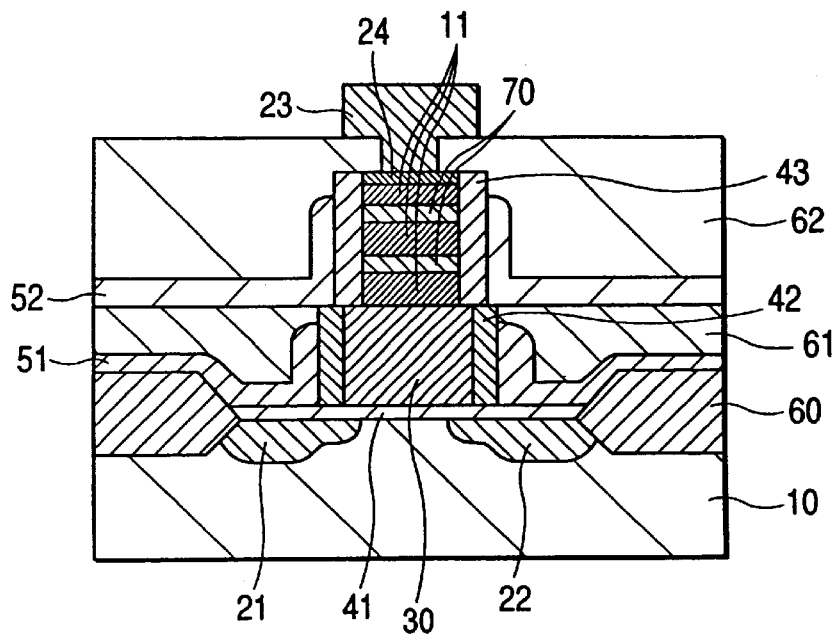
FIG. 1 is a sectional view of a first embodiment of the present invention.
Figure 2:
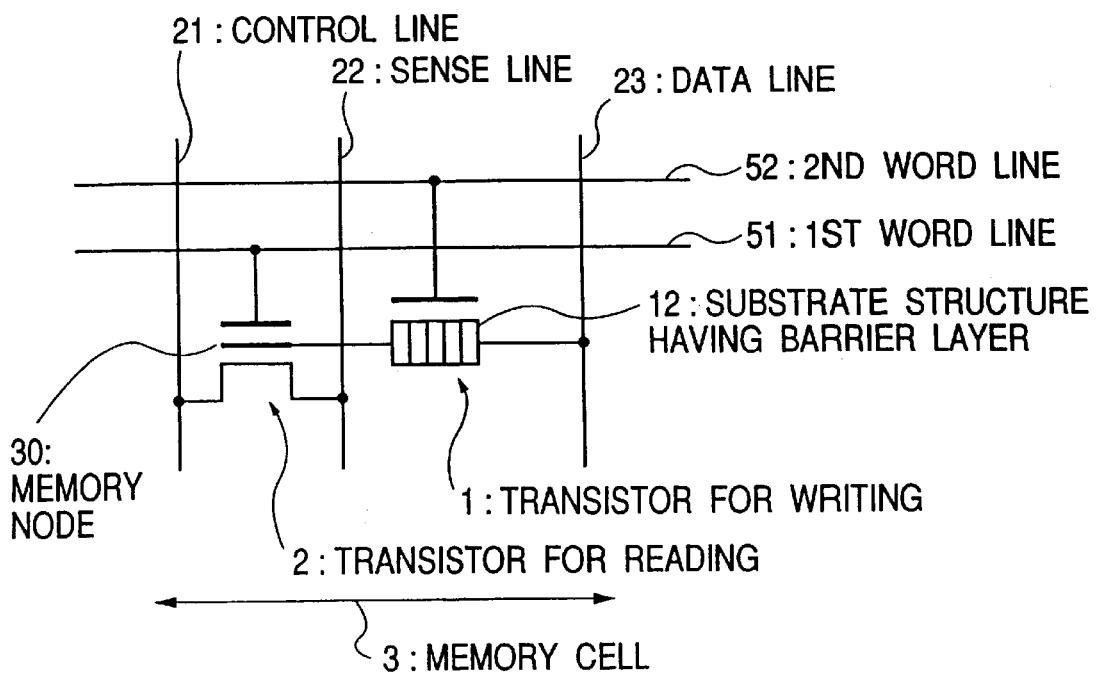
FIG. 2 is a circuit diagram of the first embodiment of the present invention.

FIGS. 1 and 2 show the structure and the circuit of a first embodiment, respectively.

FIG. 1 shows the basic structure of the present invention. Reference numeral 10 denotes a p-type silicon substrate having a resistivity of about 10 Ω-cm; 60 is a field insulator; 21 is a control line formed of an $n^+$-region; and 22 is a sense line formed of an $n^+$-region. A first gate insulator 41 is formed on the surface of the silicon substrate 10, and a memory node 30 is formed on the first gate insulator 41. A second gate insulator 42 is formed around the side wall of the memory node 30, and a first word line 51 is formed so as to cover the second gate insulator 42. An electric capacitor is thus formed, via the second insulator 42, between the first word line 51 and the memory node 30. On the memory node 30 is formed a substrate structure 12 having barrier layers, which is of a multi-layer structure composed of barrier substrates 11 made from polycrystalline silicon or amorphous silicon and barrier layers 70 made from silicon oxide, silicon nitride or the mixture thereof, that is, silicon oxide/nitride. A third gate insulator 43 is formed around the side surface of the substrate structure 11 having barrier layers. A second word line 52, which serves as a gate of a transistor using the substrate structure 7 as a substrate, is formed on the side surface of the third gate insulator 43. An $n^+$-type source region 24 is formed on the uppermost portion of the substrate structure 12 having barrier layers, and a data line 23 is formed in such a manner as to be connected to the $n^+$-type source region 24.

FIG. 2 shows the circuit and the connection of the above memory cell composed of these layers and the substrates. By arranging the memory cells in a matrix of m-columns×n-rows into a memory array, there can be obtained a large scale memory. For example, a 1-Mbit memory can be obtained by arranging the memory cells in a matrix of 1024 columns× 1024 rows.

As shown in FIGS. 1 and 2, the memory cell is composed of a transistor 1 for writing which is connected to the memory node 30 and a transistor 2 for reading which takes the memory node 30 as its gate. Also as shown in FIG. 1, the transistor 1 for writing is a transistor which takes, as a substrate, the substrate structure 12 composed of a stack of the barrier substrates 11 and the barrier layers 70 and which takes the second word line 52 as its gate.

With this configuration, since the memory node is not connected to the silicon substrate, any leakage current does not flow from the silicon substrate into the memory node, differently from the memory cell of the usual DRAM; and further, since the barrier layers as the insulators are provided between the memory node and the source, connected to the data line, of the transistor for writing, it is possible to suppress a sub-threshold current which flows, as described above, between a source and a drain of a transistor for reading and writing of stored charges in the memory cell of the usual DRAM.

According to the structure of the present invention, after the power supply is perfectly cutoff, the word line, data line, sense line, and control line are all floated, that is, become 0 V, and in this case, any leakage current does not flow from the silicon substrate into the memory node and also the electric charges in the memory node can be kept by making the barrier layers sufficiently thick or making the threshold voltage of the transistor for writing sufficiently high. Accordingly, a nonvolatile memory can be realized using such a structure of the present invention. In addition, the threshold voltage of the transistor for writing can be made sufficiently high by increasing the concentration of an impurity doped in the barrier substrate 11.

An operational condition, which does not allow the charges in the memory node to be lost during current-carrying in the memory, can be attained by suitably setting a relationship between a voltage of a non-selection word line and the threshold voltage of the transistor for writing. This allows the memory to be acted just as the usual SRAM.

Within the above operational condition, the characteristic of the inventive memory is variable between that of the perfect nonvolatile memory and that of the usual DRAM by changing the degree of suppressing the leakage current and the sub-threshold current. If the inventive memory has no barrier layer 70, it must be refreshed like the usual DRAM cell. On the other hand, if the inventive memory has the barrier layer 70 having a large thickness comparable to that of a flash memory which is one kind of nonvolatile memory, it can act as a nonvolatile memory. Accordingly, the present invention has a large advantage in that a desired function can be obtained by selecting the material of the barrier layer 70 and its thickness and also the material of the barrier substrate 11 and its impurity concentration.

To be more specific, in the case where the thickness of the barrier layer 70 of the inventive memory is made thin, a sub-threshold current is allowed to flow; however, the magnitude of the sub-threshold current is smaller than that in the usual DRAM because the sub-threshold current can be somewhat suppressed in the inventive memory, and therefore, the inventive memory can act as the usual DRAM in which the time interval of refreshment is made sufficiently longer and thereby a standby power can be reduced. The reduction in standby power enables backup using a battery or the like, and accordingly, the inventive memory can be regarded as a pseudo nonvolatile memory from the viewpoint of the entire configuration including the battery.

On the other hand, an actual large-scale memory can be realized by arranging a plurality of the memory cells in a matrix, and connecting them to each other by the control line 21, sense line 22, data line 23, first word line 51, second word line 52, and the like.

Figure 3:
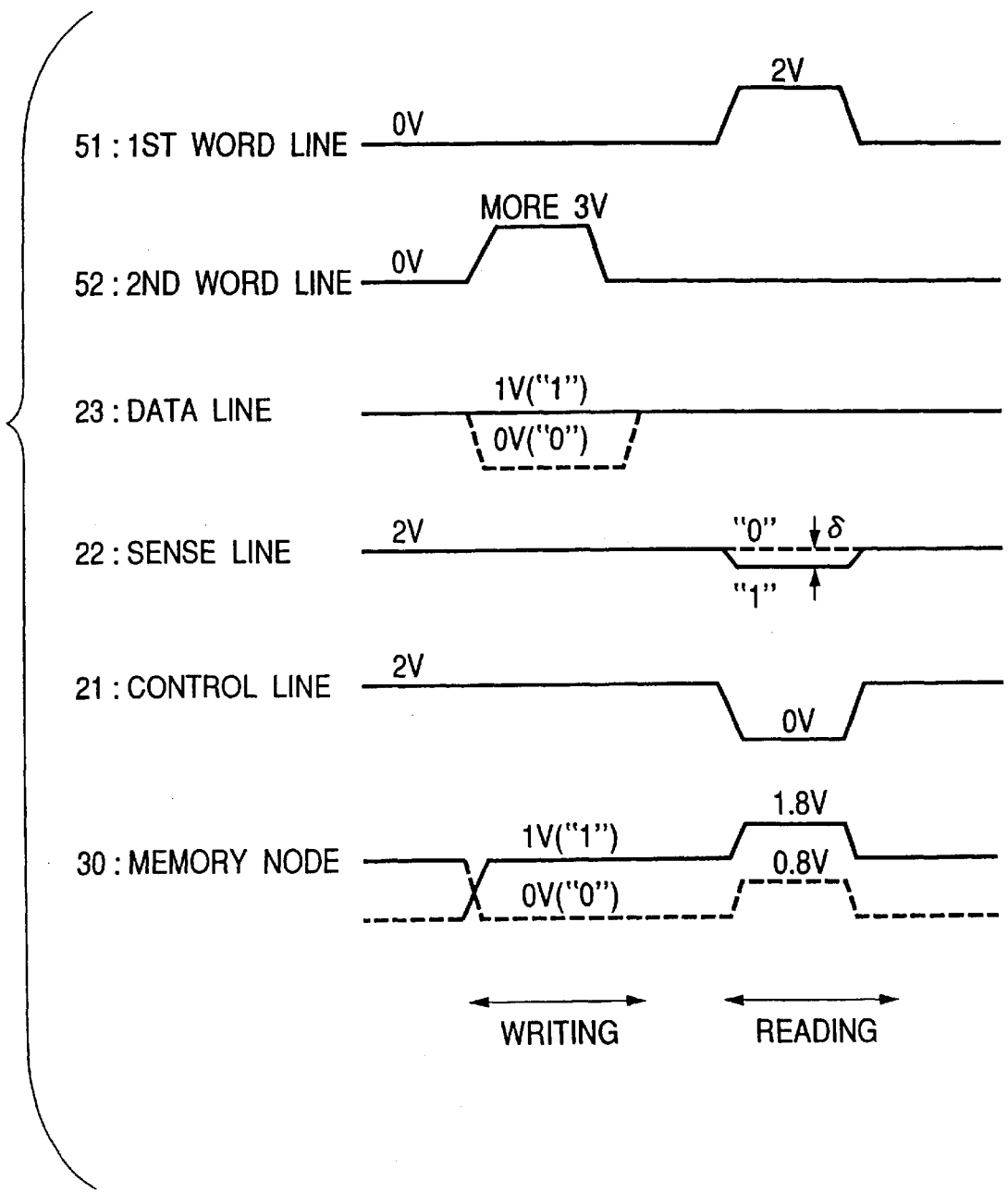
FIG. 3 is a diagram illustrating the circuit operation of the embodiment of the present invention.

FIG. 3 is a timing chart showing writing and reading operations to and from the memory cell of the present invention. In this timing chart, it is assumed that the threshold voltages of the transistor for writing and the transistor for reading are taken as 2 V and 1.2 V, respectively; and a voltage coupled to the memory node 30 by the electric capacitor formed, via the first gate insulator 41, between the first word line 51 and the memory node 30 is taken as 0.8 V.

The writing operation is performed by applying pulses to the second word line, and applying a writing information voltage 1 V (corresponding to information "1") or 0 V (corresponding to information "0") applied to the data line to the memory node. Here, since the voltage of the word line is as sufficiently high as 3 V or more, the voltage of the data line is written to the memory node as it is without being affected by the threshold voltage (2 V) of the transistor for writing.

The reading operation is performed by applying pulses to the first word line and the control line, and discriminating whether or not the transistor for reading is made conductive. To be more specific, it is discriminated whether the information is "1" or "0" on the basis of the presence or absence of a current flowing in the sense line or the presence or absence of a micro-voltage appearing in the sense line. For example, the voltage of the memory node is increased to 1.8 V or 0.8 V by applying pulses to the first word line, and in this case, since the voltage of the control line is 0 V and the threshold voltage of the transistor for reading is 1.2 V, if the information "1" is stored in the memory node, the transistor for reading is made conductive, and if the information "0" is stored in the memory node, the transistor for reading is made non-conductive. By connecting an impedance (MOS transistor or resistor) of 2 V to the other end of the sense line, upon readout of the information "1", the voltage of the sense line is reduced a micro-voltage δ (about 200 mV) from 2 V; while upon readout of the information "0", the voltage of the sense line is left as 2 V. Such a difference in voltage is discriminated by a detection circuit connected to the sense line.

It is to be noted that the reading operation is not obstructed by a number of non-selection cells connected to the same sense line and control line and arranged in the direction of the sense line. The reason for this is that since the first word lines of the non-selection cells are not applied with pulses, the memory node of each of the non-selection cells is 1 V or 0 V which is lower than the threshold voltage of the transistor for reading, and accordingly the transistor for reading in each of the non-selection cells is in the non-conductive state.

In the memory cell structure of the present invention, as described above, the leakage current at the pn-junction in the cell little occurs and also a resistance against soft errors due to the incidence of α-particles is high. However, depending on the magnitude of the threshold voltage of the transistor for writing, information charges possibly flow into the data line via the transistor for writing, thereby causing breakage of the information. If the threshold voltage is as sufficiently high as about 2 V, even if the power supply is cutoff and the word line and the like are floated and become 0 V, the nonvolatile operation is possible because the transistor for writing is made nearly perfectly non-conductive; and further, charges in the non-selection cells do not flow in the data line even upon random operation during current-carrying. As a result, in the case where the threshold voltage is sufficiently high, there can be provided a memory not requiring refreshment like the usual SRAM.

However, depending on the configuration of the barrier layer, or in the case where it is desired to lower the voltage applied to the second word line for low voltage operation, there inevitably occur circumstances in which the threshold voltage is lowered. However, if the threshold voltage is excessively lowered, charges in the memory node start to flow in the data line via the transistor for writing. In such a case, like the usual DRAM, the memory must be refreshed to keep the stored information. The refreshing operation is performed by reading the information in the memory cell by a detection circuit connected to the sense line, converting the result into a writing voltage on the data line, and re-writing it to the memory cell. Of course, the memory cell of the present invention has an advantage that since the leakage current at the pn-junction in the memory cell little occurs, the information holding time can be correspondingly prolonged as compared with the usual DRAM cell.

The operations of transistors, each using a substrate having one or more barrier layers, will be described with reference to FIGS. 4 to 9.

Figure 4:
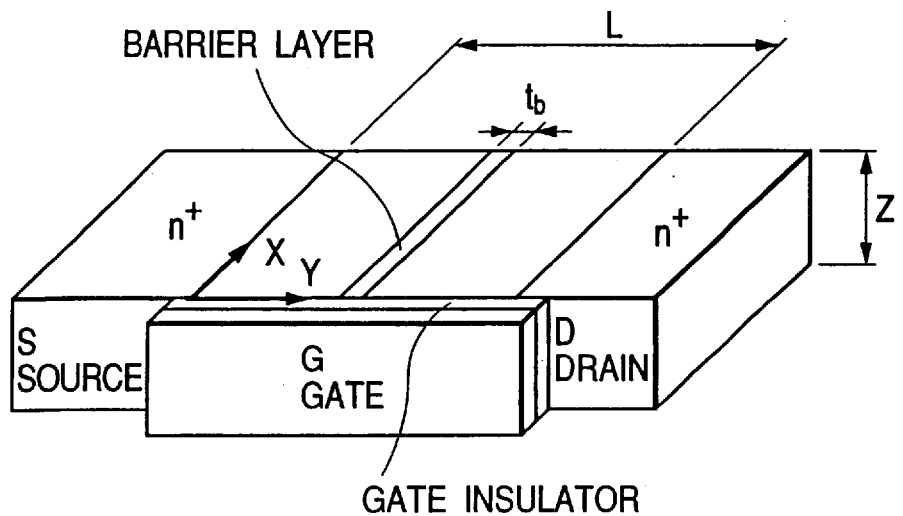
FIG. 4 is a view illustrating an operation of the embodiment of the present invention.

FIG. 4 shows the structure of a transistor using a substrate having a barrier layer, in which a single barrier layer having a thickness of tb is inserted in a substrate of the usual n-channel transistor at an intermediate portion between a source and a drain.

Figure 5:
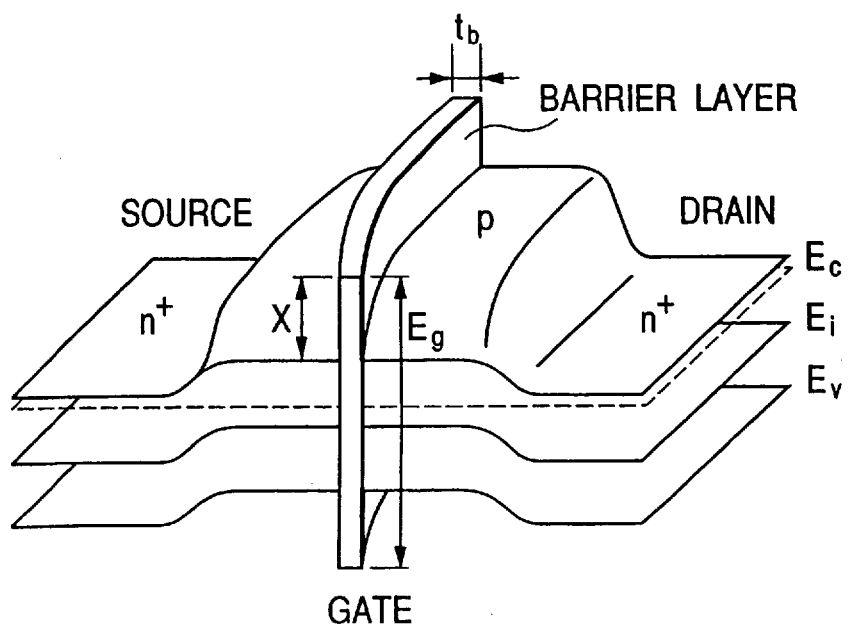
FIG. 5 is a view illustrating an operation of the embodiment of the present invention.

FIG. 5 shows the energy band structure of the transistor shown in FIG. 4. In general, the barrier layer is an insulator having a forbidden band energy gap Eg. For this n-channel transistor using the substrate having the single barrier layer, there exists a conduction band of the barrier layer at a level which is higher an electron affinity "c" than that of the conductor Ec.

In the state shown in FIG. 5 in which no gate voltage is applied, in order to allow a current between the source and the drain of the transistor, it is required to satisfy either a condition that the barrier layer is thin enough to allow a tunnel current to directly pass through the barrier layer or a condition that electrons have energies large enough to flow over the electron affinity "c". The transistor actually exhibits a current form intermediate between the above conditions depending on the thickness of the barrier layer.

Figure 6:
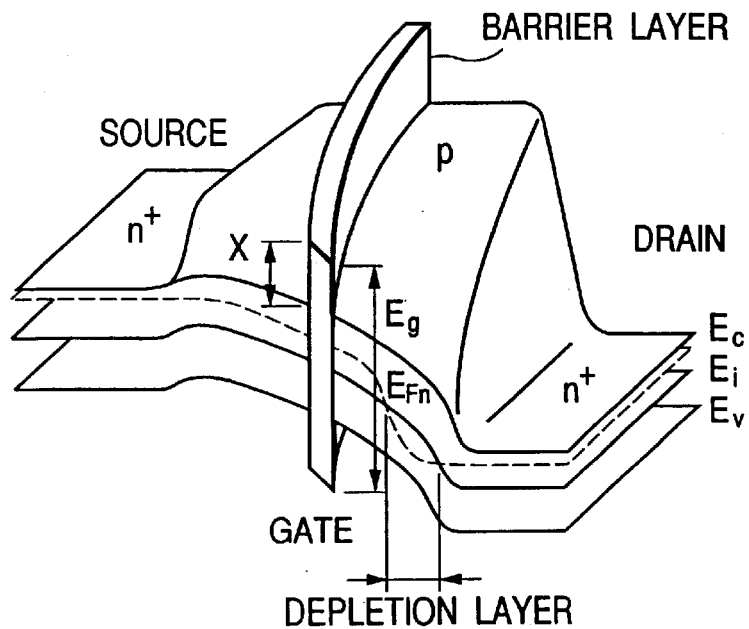
FIG. 6 is a view illustrating an operation of the embodiment of the present invention.

FIG. 6 shows the energy band structure in the case where a positive gate voltage is applied to the structure shown in FIG. 5. The current flowing between the source and the drain of the transistor can be controlled by a gate G, as shown in FIG. 6. Like the general transistor, when a positive voltage larger than the threshold voltage of the transistor is applied, the energy band is largely reduced toward the gate plane, to thereby increase the current flowing between the source and the drain. Further, the energy of the conduction band of the barrier insulator is made lower than the energy level of the source although the electron affinity "c" is kept constant, so that the current is easy to flow over the barrier layer. The present invention applies such a principle and uses the drain of the transistor as the memory node of the memory cell.

Figure 7:
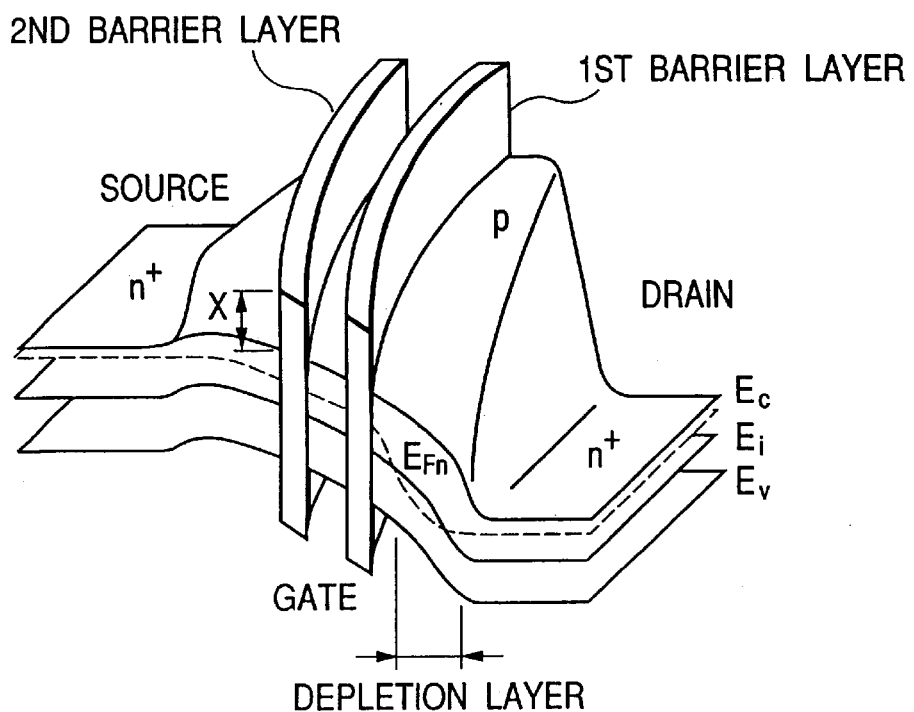
FIG. 7 is a view illustrating an operation of the embodiment of the present invention.

FIG. 7 shows the energy band structure of a transistor using a substrate having two layers of barrier insulators. In general, in the case of provision of multi-layered insulators, the probability allowing electrons to tunnel through the multi-layered insulators is equal to that allowing electrons to tunnel through a single insulator having a thickness equal to the total thickness of the multi-layered insulators. Accordingly, in the case where it is difficult to form a single thick barrier insulator, there may be provided multi-layered barrier insulators having a desired total thickness.

Figure 8:
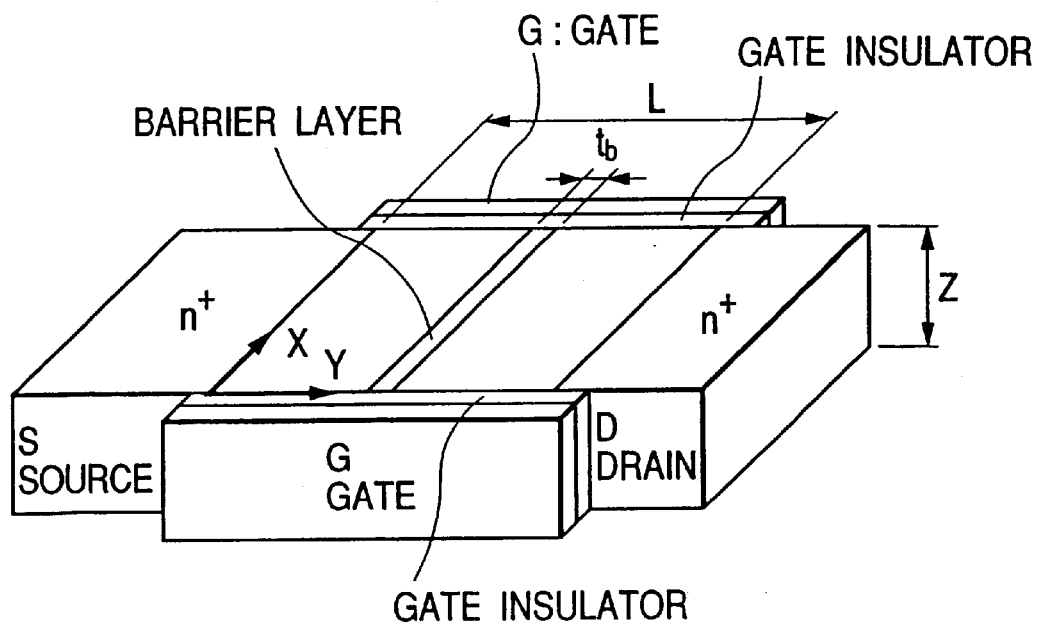
FIG. 8 is a view illustrating an operation of the embodiment of the present invention.

FIG. 8 shows another structure of the present invention, in which a substrate having a barrier layer is sandwiched by two gates. Since no voltage is applied from the exterior to the substrate having the barrier layer as in the structure shown in FIG. 1, the substrate having the barrier layer is in the so-called floating state.

Figure 9:
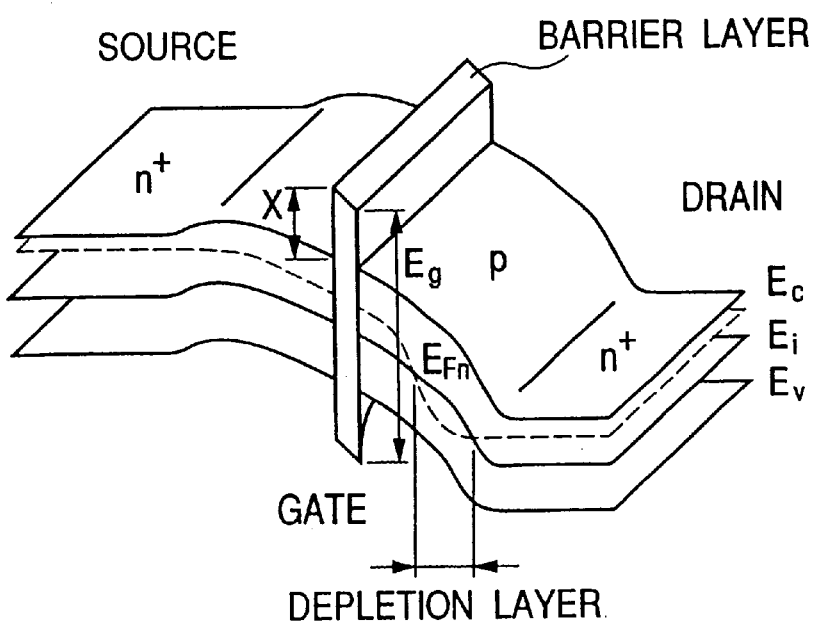
FIG. 9 is a view illustrating an operation of the embodiment of the present invention.

FIG. 9 shows the energy band structure of the transistor using the substrate having the barrier layer shown in FIG. 8. Since the substrate having the barrier layer is in the floating state, if the concentration of an impurity doped in the substrate is kept constant in the direction parallel to the source and the drain, as shown in FIG. 9, any electric field is not present in the direction parallel to the source and the drain, and thereby the energy band is made flat in the direction parallel to the source and the drain. In this case, the current flowing between the source and the drain is equalized over the substrate, and consequently, as compared with the case shown in FIG. 6 where the current flows on the surface of the substrate directly under the gate, the reduction in mobility of carriers, that is, electrons becomes small for the n-channel transistor. As a result, there can be realized a transistor having a high mutual conductance.

As will be fully described with reference to the later embodiment of the present invention, since the structure shown in FIGS. 8 and 9 does not require an electrode for applying an external voltage to the substrate having the barrier layer, there can be obtained advantages that not only the structure of the memory cell can be simplified but also the plane area can be reduced.

The substrate structure using the two barrier layers shown in FIG. 7 can be applied to the transistor shown in FIGS. 8 and 9. In this case, the same effect can be obtained.

Although the n-channel transistor formed on the p-type substrate is used for the configurations shown in FIGS. 3 to 9 for simplification of description of the operation of the present invention, the present invention is not limited to the conducting type of the substrate insofar as the current flowing between the source and the drain can be essentially controlled by the gate. That is to say, in the present invention, there can be used various types of substrates, for example, a very lightly doped n+-type substrate, an intrinsic type substrate having an extremely high resistivity, and a p-type substrate. If it is desired to control the substrate by applying a low voltage thereto, the impurity concentration near that of the intrinsic type may be selected.

On the other hand, for the p-type barrier substrate, a pn-junction is formed between the drain and the barrier substrate, and in this case, if a depletion layer is present, thermal excitation charges are generated at the depletion layer, causing breakage of the stored information. Accordingly, in this case, the kind of an impurity and the concentration thereof may be controlled to minimize the thermal excitation charges.

Figure 10:
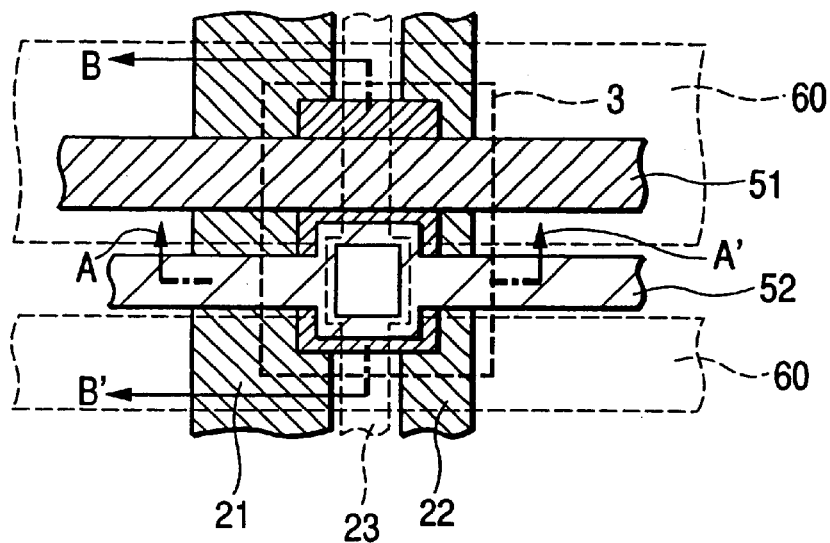
FIG. 10 is a plan view of a second embodiment of the present invention.
Figure 11:
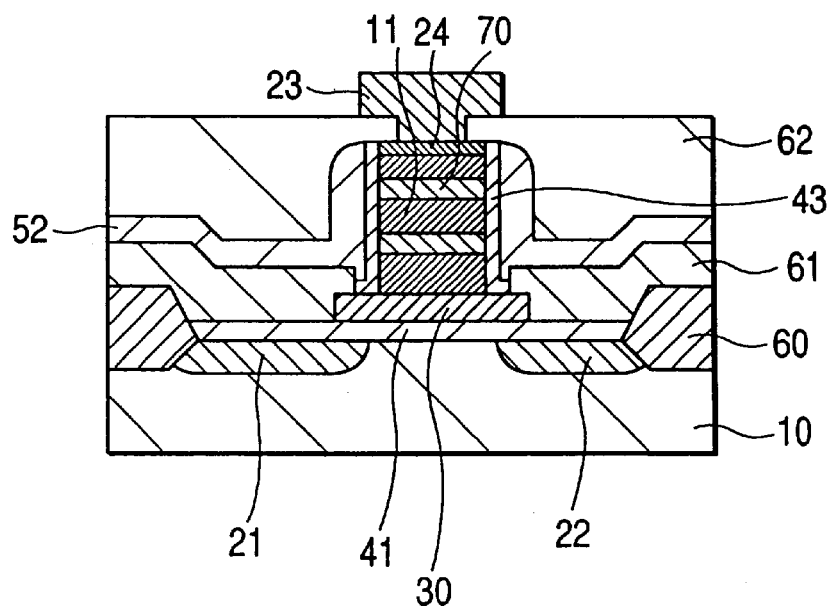
FIG. 11 is a sectional view of the second embodiment of the present invention.
Figure 12:
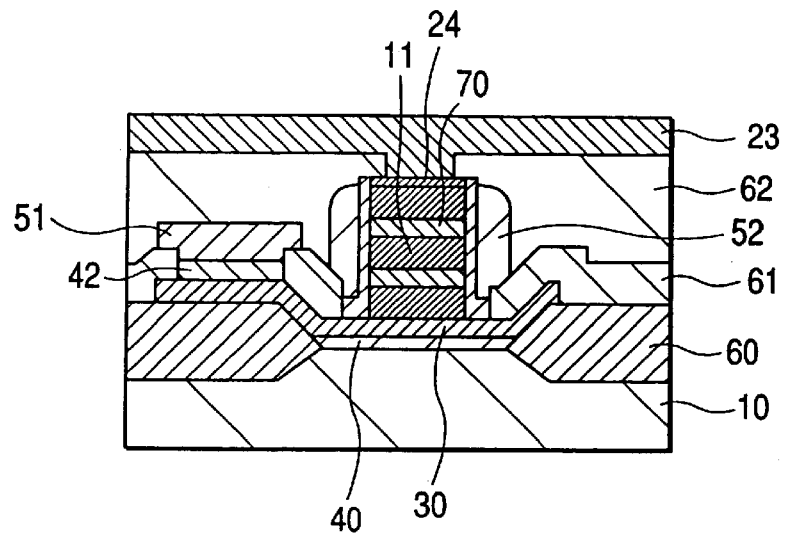
FIGS. 12 to 16 are views illustrating a sequence of steps of manufacturing the second embodiment of the present invention.

FIG. 10 is a plan view of a memory cell according to a second embodiment of the present invention. This embodiment is characterized in that a memory node 30 is flatly extended and a first word line 51 is not located directly under a second word line 52. With this configuration, the overall height of this embodiment is made lower than that of the first embodiment, and therefore, it is easier to form this embodiment as compared with the first embodiment. FIG. 11 is a sectional view taken on line A–A' of the memory cell shown in FIG. 10; and FIG. 12 is a sectional view taken on line B–B' of the memory cell shown in FIG. 10. In addition, parts corresponding to those shown in FIG. 1 are denoted by the same reference numerals as those shown in FIG. 1.

FIGS. 13 to 16 show sequential steps of forming the second embodiment of the present invention.

Figure 13:
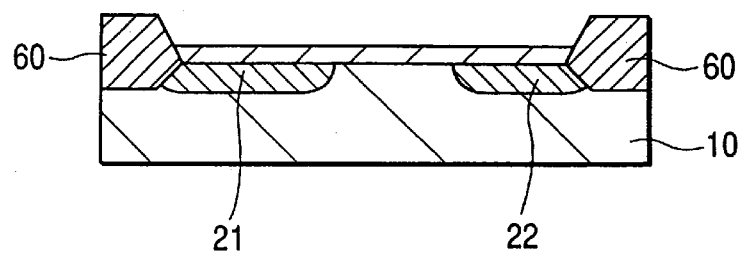

As shown in FIG. 13, n+-type regions 21 and 22 are formed in a p-type silicon substrate having a resistivity of about 10 Ω-cm by the usual photo-etching process and ion implantation process. A field insulator 60 made from a silicon oxide layer having a thickness of 500 nm is then selectively formed by a LOCOS (Local Oxidation of Silicon) process using a silicon nitride layer selectively formed for prevention of oxidation.

Figure 14:
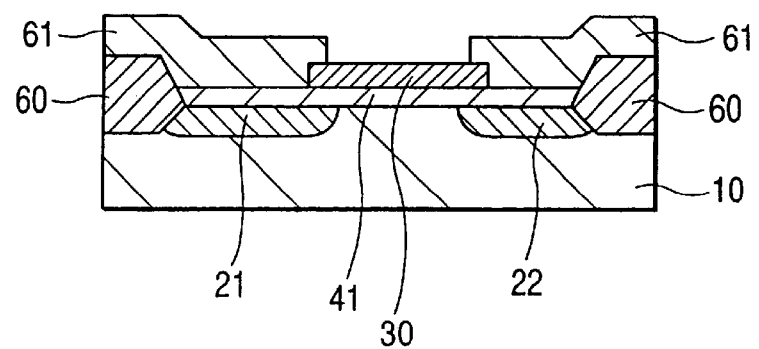

As shown in FIG. 14, a silicon oxide layer having a thickness of 10 nm is formed on the surface of the substrate 10 at 1000° C. This silicon oxide layer is taken as a first gate insulator 41. On the first gate insulator 41 is selectively formed a layer of polycrystalline silicon doped with an n+-type impurity, which layer is taken as a memory node 30. Then, as already shown in FIG. 11, a first interlayer insulator 61 having a thickness of 500 nm is formed by CVD; a portion of the first interlayer insulator 61, positioned on a certain area of the memory node 30, is removed; and a silicon oxide layer having a thickness of 10 nm is formed on the surface of the memory node 30 at the above area from which the first interlayer insulator 61 is removed. This silicon oxide layer is taken as a second gate insulator 42. On the second gate insulator 42 is selectively formed a layer of conductive polycrystalline silicon, which layer is taken as a second word line 52.

Figure 15:
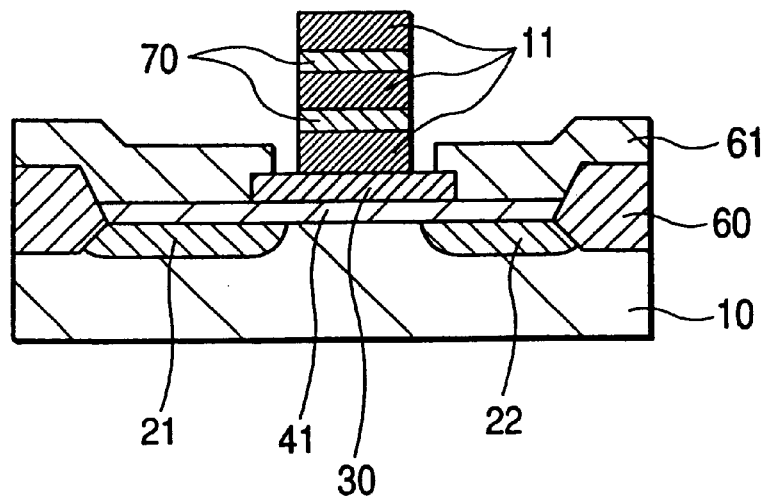

As shown in FIG. 15, a barrier substrate 11 made from polycrystalline silicon or amorphous silicon is formed on the memory node 30 to a thickness of 500 nm, followed by heat-treatment at 1000° C. in an oxygen atmosphere containing ammonia or nitrogen to form a silicon oxide/nitride layer having a thickness of 5 nm, which layer is taken as a barrier layer 70. In FIG. 12, three barrier substrates 11 and two barrier layers are formed. The minimum number of the barrier substrates is two, and the minimum number of the barrier layer 70 is one.

Then, as already shown in FIG. 12, a second gate insulator 42 having a thickness of 10 nm is formed by the usual thermal oxidation process at 1000° C., and a first word line 51, represented by a layer of polycrystalline silicon doped with an impurity, W or Mo or a silicide layer thereof, is formed on the second gate insulator 42.

Figure 16:
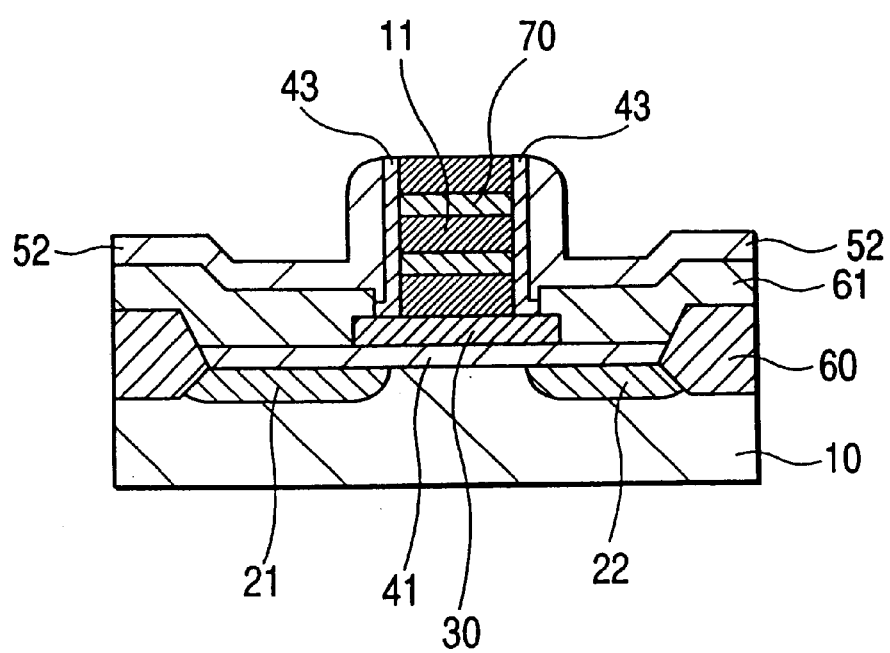

As shown in FIG. 16, a silicon oxide/nitride layer having a thickness of 5 nm is formed by heat-treatment at 1000° C. in an oxygen atmosphere containing ammonia or nitrogen, which layer is taken as a third gate insulator 43. Then, a layer of conductive polycrystalline silicon is formed over the entire surface, and is subjected to anisotropic dry etching in a state in which a photoresist is left on a portion at which a second word line 52 is to be formed, to form a second word line 52 at the desired portion. At this time, the second word line 52 remains on the side wall of the projecting multi-layered substrate structure 7 having the barrier substrates 11 and the barrier layers 70 even if the side wall of the substrate structure 7 is not covered with the photoresist. The reason for this is that the etching does not proceed in the horizontal direction because of the use of the strong anisotropic dry etching. This means that the second word line 52 can be formed in self-alignment around the substrate structure 7 having the barrier layers.

As already shown in FIGS. 11 and 12, a drain region 24 doped with arsenic or phosphorous is formed, and then like the first interlayer insulator 61, a second interlayer insulator 62 is formed. Then, an opening is formed in the second interlayer insulator 62, and a data line 23 made from aluminum or the like is selectively formed in the opening. In this way, the memory cell of the present invention, whose circuit is shown in FIG. 2, can be realized. In comparing this memory cell with the first embodiment, since in this memory cell the first word line 51 is formed on the plane adjacent to the second word line 52, the plane area becomes larger. To be more specific, in this memory cell, assuming that the processing dimension of all patterns is taken as F and the pattern alignment accuracy is taken as 2/F, the theoretical area becomes 13.5 (=3.0×4.5)$F^2$.

Figure 17:
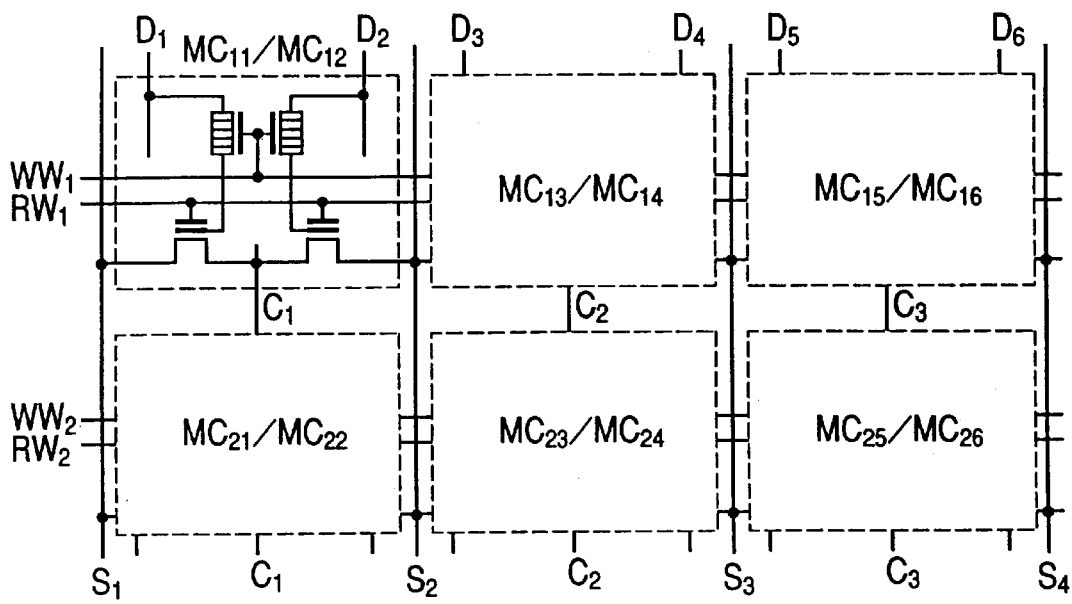
FIG. 17 is a diagram illustrating a memory array of the embodiment of the present invention.

FIG. 17 shows another embodiment of the present invention in which memory cells are arranged in a matrix to constitute a memory array. In this embodiment, the sense line and the control line adjacent to each other are shared to reduce the entire area.

Figure 18:
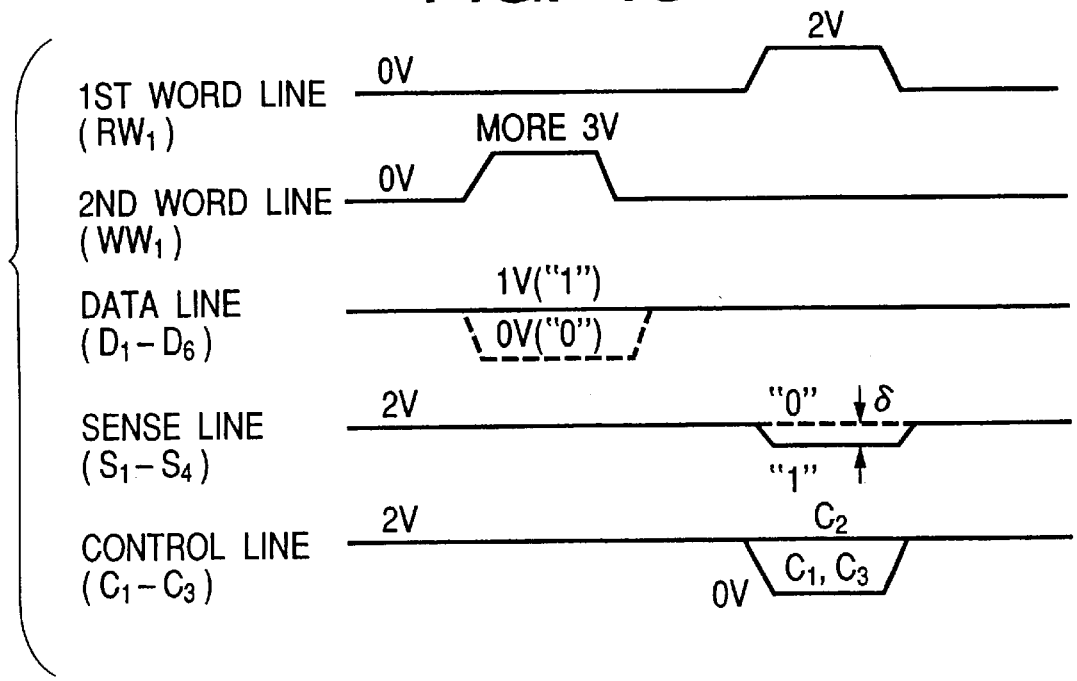
FIG. 18 is a diagram illustrating a circuit operation of the memory array of the embodiment of the present invention.

FIG. 18 is a timing chart showing a circuit operation of the memory cell shown in FIG. 17. As shown in FIG. 18, the writing operation is performed by applying pulses to a second word line ($WW_1$) and applying desired wiring information voltages to respective data lines ($D_1$, $D_2$, ...) of a plurality of cells ($MC_{11}$, $MC_{12}$, $MC_{13}$, ...) connected to the second word line. That is to say, the plurality of cells are simultaneously, collectively written. The reading operation is performed, in consideration of the fact that sense lines ($S_1$, $S_2$, $S_3$, $S_4$, ...) are shared by the adjacent cells in the word line direction, by selectively driving alternate control lines ($C_1$, $C_2$, ...) with address signals in order to eliminate interference between the cells. For example, FIG. 18 shows an example in which the odd-numbered control lines are driven. The pieces of information readout from the cells $M_{11}$, $M_{12}$, $M_{15}$, $M_{16}$ are led into the sense lines $S_1$, $S_2$, $S_3$ and $S_4$, and no information is readout from the $MC_{13}$ and $M_{14}$. Although the memory node of each of the cells $MC_{13}$ and $MC_{14}$ is 1.8 V or 0.8 V, the transistor for reading in each cell is made non-conductive because the voltage of the control line $C_2$ is 2 V, the voltage of each of the sense lines $S_2$ and $S_3$ is 2V-δ (about 200 mV), and the threshold voltage of the transistor for reading is 1.2 V.

In addition, the sense lines may be respectively provided to the adjacent cells. In this case, although the area of the memory cell becomes larger, there has an advantage in simplifying the circuit design because there is no need to decode the control lines with address signals for selective drive of the control lines.

Figure 19:
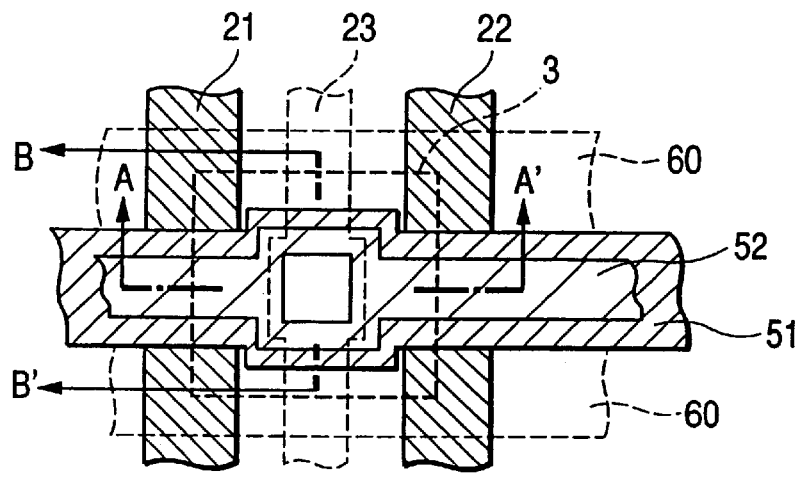
FIG. 19 is a plan view of the first embodiment of the present invention.

FIG. 19 is a plan view of the first embodiment of the present invention, similar to the plan view of the second embodiment shown in FIG. 10. In this embodiment, the theoretical area of the memory cell becomes 9.0 (=3.0×3.0) $F^2$, which is largely reduced as compared with that of the second embodiment shown in FIG. 10.

Figure 20:
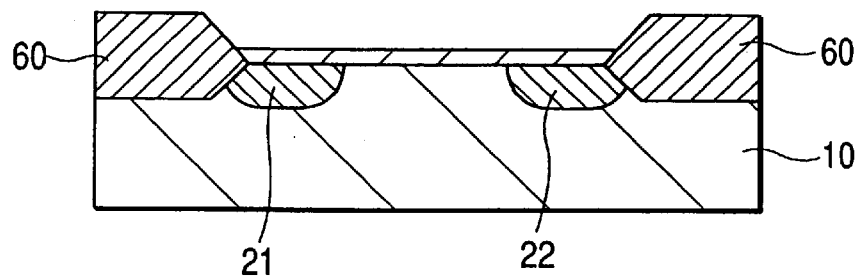
FIGS. 20 to 23 are views of a sequence of steps of manufacturing the first embodiment of the present invention.

FIGS. 20 to 23 show sequential steps of forming the first embodiment of the present invention. As shown in FIG. 20, $n^+$-type regions 21 and 22 are formed in a p-type silicon substrate having a resistivity of about 10 Ω-cm by the usual photo-etching process and ion implantation. A field insulator 60 made from a silicon oxide layer having a thickness of 500 nm is selectively formed by LOCOS (Local Oxidation of Silicon) using a silicon nitride layer selectively formed for prevention of oxidation.

Figure 21:
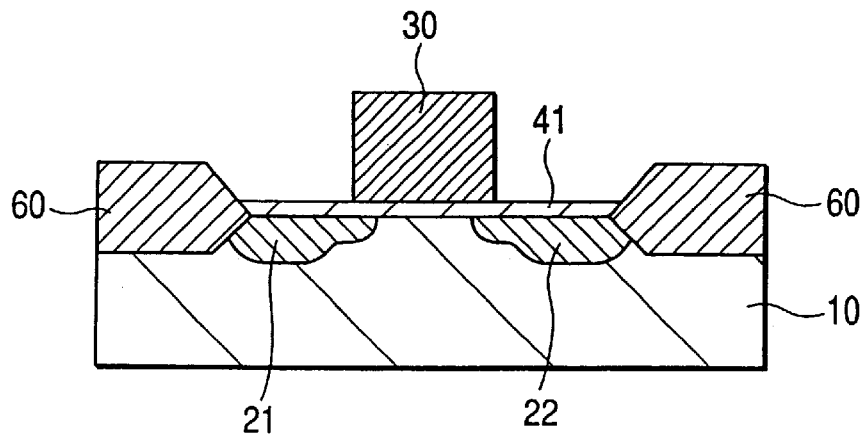

As shown in FIG. 21, a silicon oxide layer having a thickness of 10 nm is formed at 1000° C. on the surface of the substrate 10, which layer is taken as a first gate insulator 41. On the first gate insulator 41 is selectively formed a layer of polycrystalline silicon doped with an $n^+$-type impurity, which layer is taken as a memory node 30. Then, extension portions of the $n^+$-type regions 21 and 22 are formed in self-alignment with the memory node 30 by ion implantation, to thereby realize the so-called LDD (Lightly Doped Drain) structure.

Figure 22:
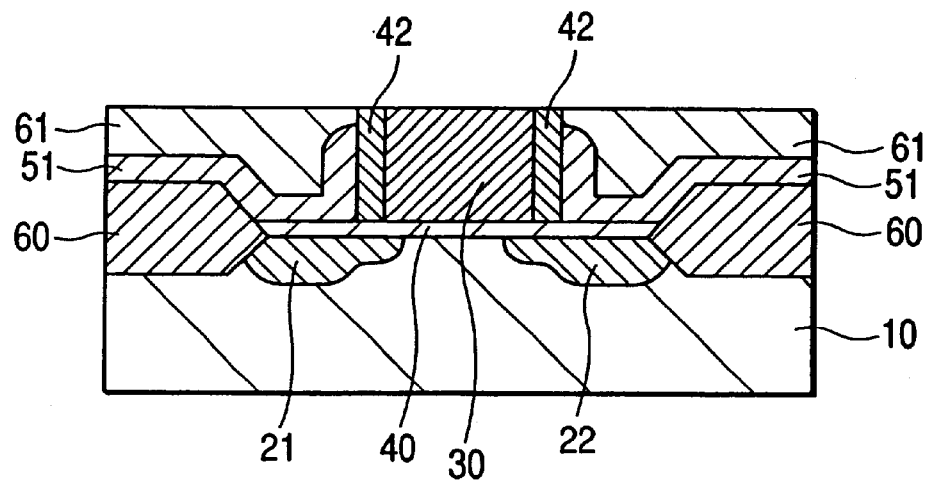

As shown in FIG. 22, a silicon oxide layer having a thickness of 10 nm is formed at 1000° C. on the surface of the memory node 30, which layer is taken as a second gate insulator 42. A layer of conductive polycrystalline silicon is then formed over the entire surface, and is subjected to anisotropic dry etching in a state in which a photoresist is left on a portion at which a first word line 51 is to be formed, to form a first word line 51 at the desired portion. At this time, the first word line 51 remains on the side wall of the projecting memory node 30 even if the side wall of the memory node 30 is not covered with the photoresist. This is because the etching does not proceed in the horizontal direction resulting from the use of the strong anisotropic dry etching. This means that the first word line 51 can be formed in self-alignment around the memory node 30. Then, a first interlayer insulator 61 having a thickness of 500 nm is formed by CVD, followed by planarization of the entire surface of the first interlayer insulator 61 using a CMP (Chemical Mechanical Polishing) process, to expose the uppermost surface of the memory node 30.

Figure 23:
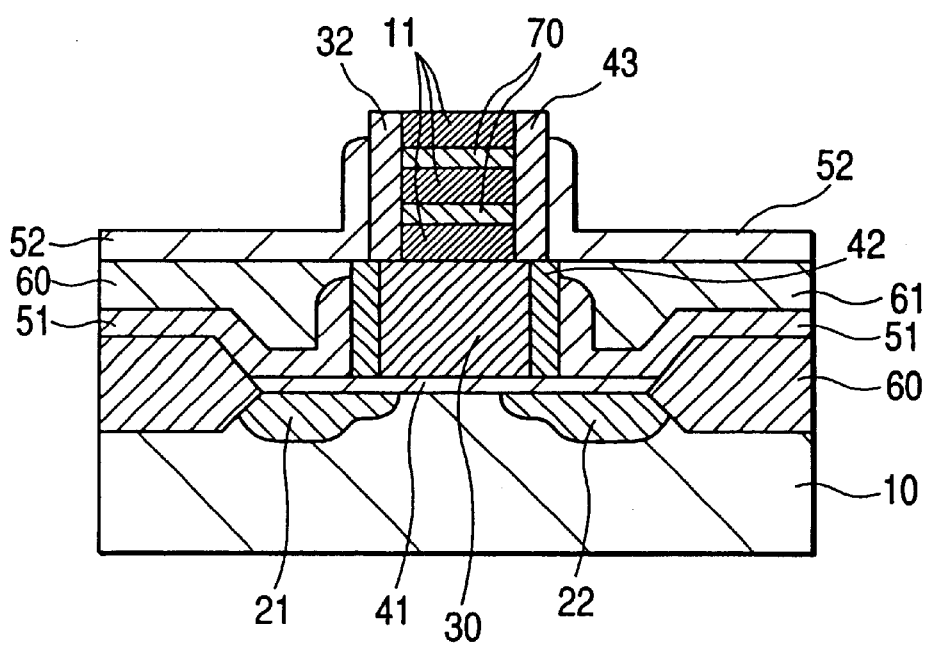

As shown in FIG. 23, a barrier substrate 11 made from polycrystalline silicon or amorphous silicon is formed to a thickness of 500 nm, followed by heat-treatment at 1000° C. in an oxygen atmosphere containing ammonia or nitrogen to form a silicon oxide/nitride layer having a thickness of 5 nm, which layer is taken as a barrier layer 70. Then, a silicon oxide/nitride layer having a thickness of 5 nm is formed by heat-treatment at 1000° C. in an oxygen atmosphere containing ammonia or nitrogen, which layer is taken as a third gate insulator layer 43. Then, a layer of conductive polycrystalline silicon is formed over the entire surface, and is subjected to anisotropic dry etching in a state in which a photoresist is left on a portion at which a second word line 52 is to be formed, to form a second word line 52 at the desired portion. At this time, the second word line 52 remains on the side wall of the projecting multi-layered substrate structure 7 having the barrier substrates 11 and the barrier layers 70 even if the side wall of the substrate structure 7 is not covered with the photoresist. The reason for this is that the etching does not proceed in the horizontal direction because of the use of the strong anisotropic dry etching. This means that the second word line 52 can be formed in self-alignment around the substrate structure 7 having the barrier layers.

Figure 24:
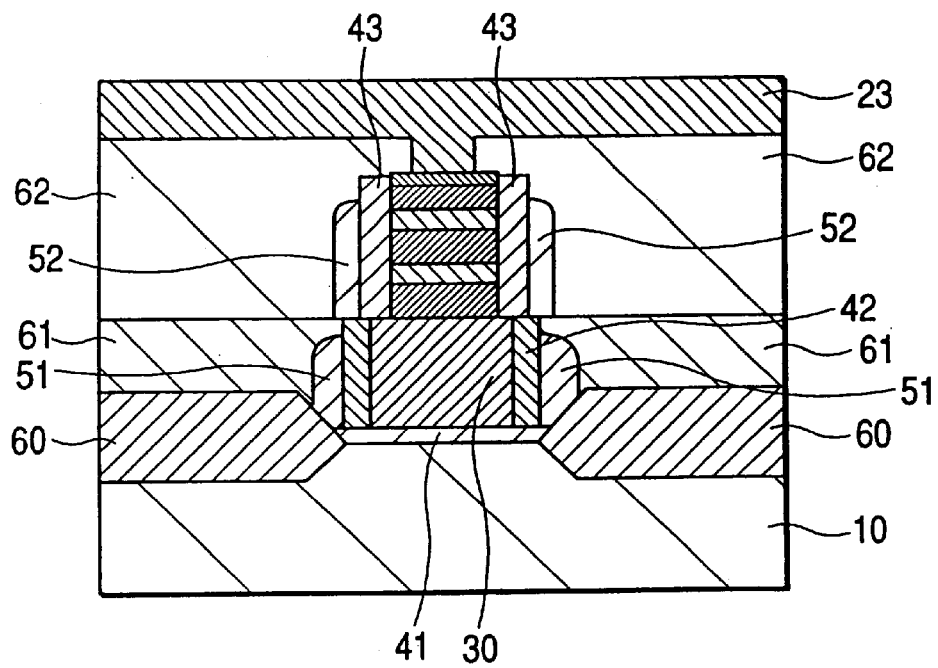
FIG. 24 is a sectional view of the first embodiment of the present invention.

As already shown in FIG. 1, a drain region 24 doped with arsenic or phosphorous is formed, and then like the first interlayer insulator 61, a second interlayer insulator 62 is formed. Then, an opening is formed in the second interlayer insulator 62, and a data line 23 made from aluminum or the like is selectively formed in the opening. In this way, the memory cell of the present invention, whose circuit is shown in FIG. 2, can be realized. FIG. 1 is a sectional view taken on line A–A' of FIG. 19; and FIG. 24 is a sectional view taken on line B–B' of FIG. 19. In this embodiment, as described above, the theoretical area of the memory cell is $9F^2$. In other words, according to this embodiment, the smallest cell can be realized.

Figure 25:
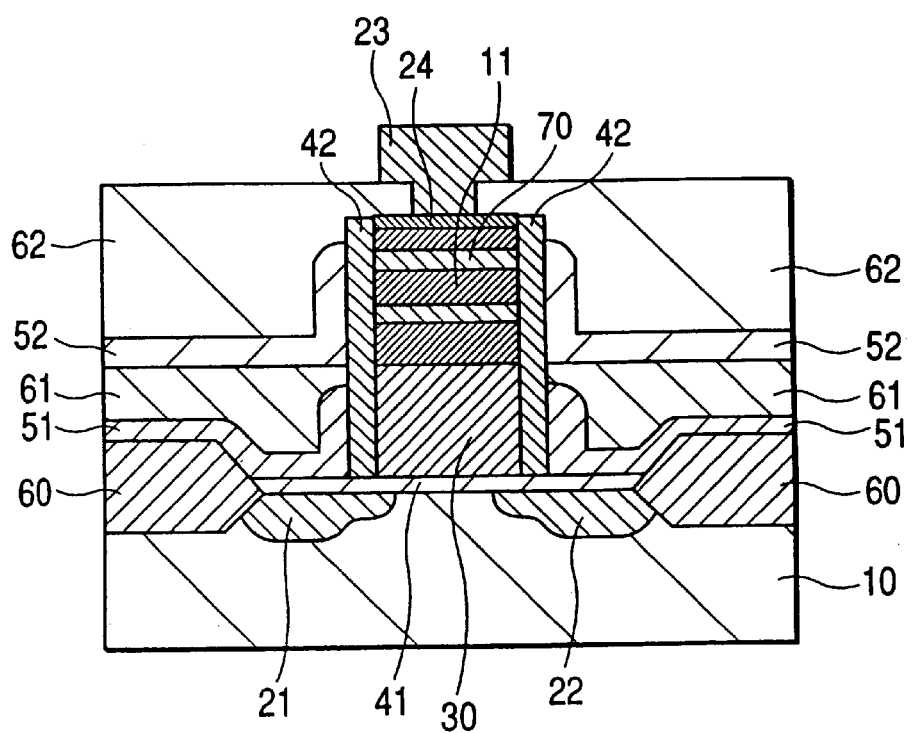
FIG. 25 is a sectional view of a third embodiment of the present invention.

FIG. 25 shows a third embodiment of the present invention, in which a memory node 30 and a substrate structure 7 having barrier substrates 11 and barrier layers 70 are collectively formed. In this embodiment, a finer structure can be realized by eliminating mask alignment required for the memory node 30 and the substrate structure 7 at the photo-etching step in the first embodiment.

Figure 26:
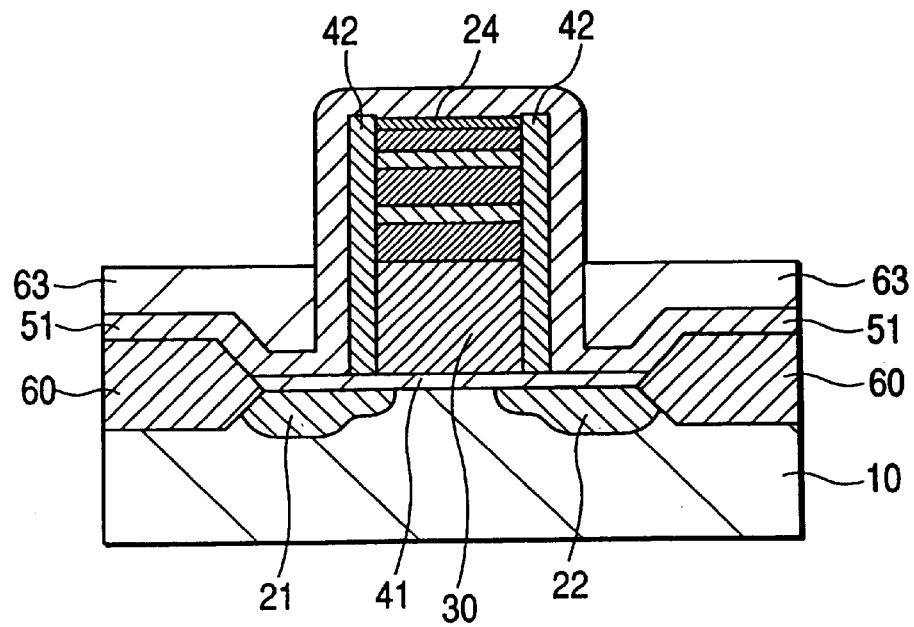
FIGS. 26 to 28 are views of a sequence of steps of manufacturing the third embodiment of the present invention.
Figure 27:
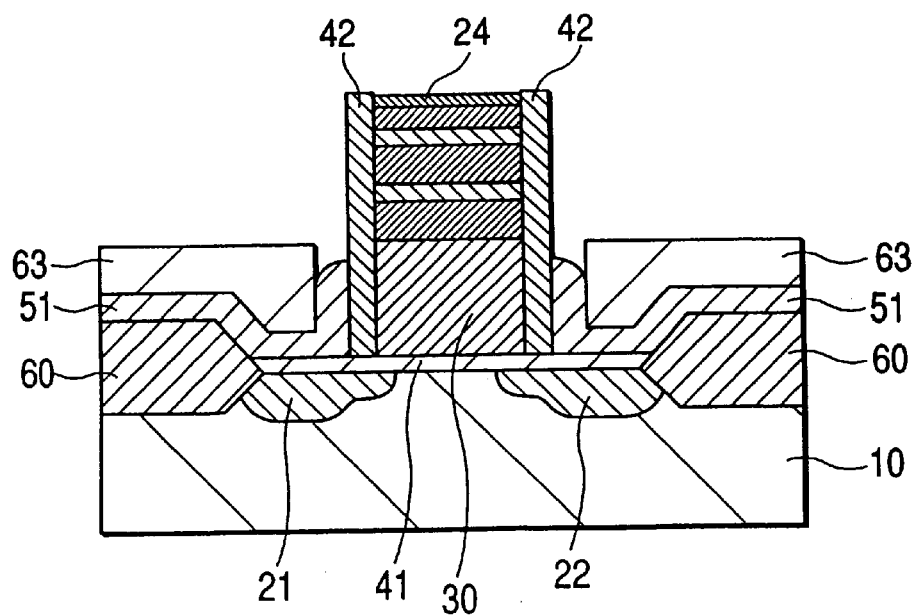
Figure 28:
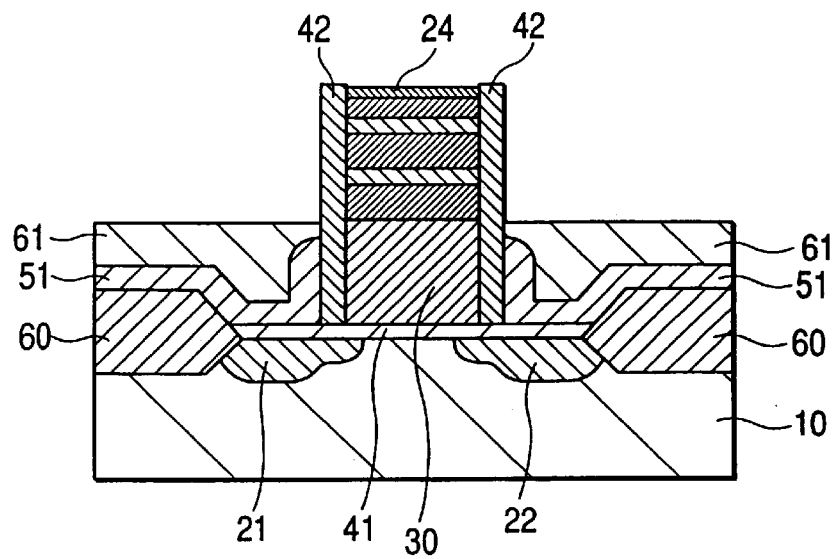

FIGS. 26 to 28 illustrate part of sequential steps of forming the third embodiment. As shown in FIG. 26, after the memory node 30 and the substrate structure 7 having barrier layers are collectively formed, a silicon oxide/nitride layer having a thickness of 5 nm is formed by heat-treatment at 1000° C. in an oxygen atmosphere containing ammonia and nitrogen, which layer is taken as a second gate insulator 42. Then, a layer of conductive polycrystalline silicon is formed over the entire surface by CVD or the like. Further, an etching protective layer made from photoresist or polyimide is formed by CVD, followed by etch-back over the entire surface to thin the layer to a specific thickness, to obtain an etching protective layer 63.

The conductive poly-silicon layer is etched using the etching protective layer 63 as a mask, to form a first word line 51 as shown in FIG. 23. After that, the steps having described with reference to FIGS. 23, 24 and 1 are repeated, to realize the structure shown in FIG. 21.

Figure 29:
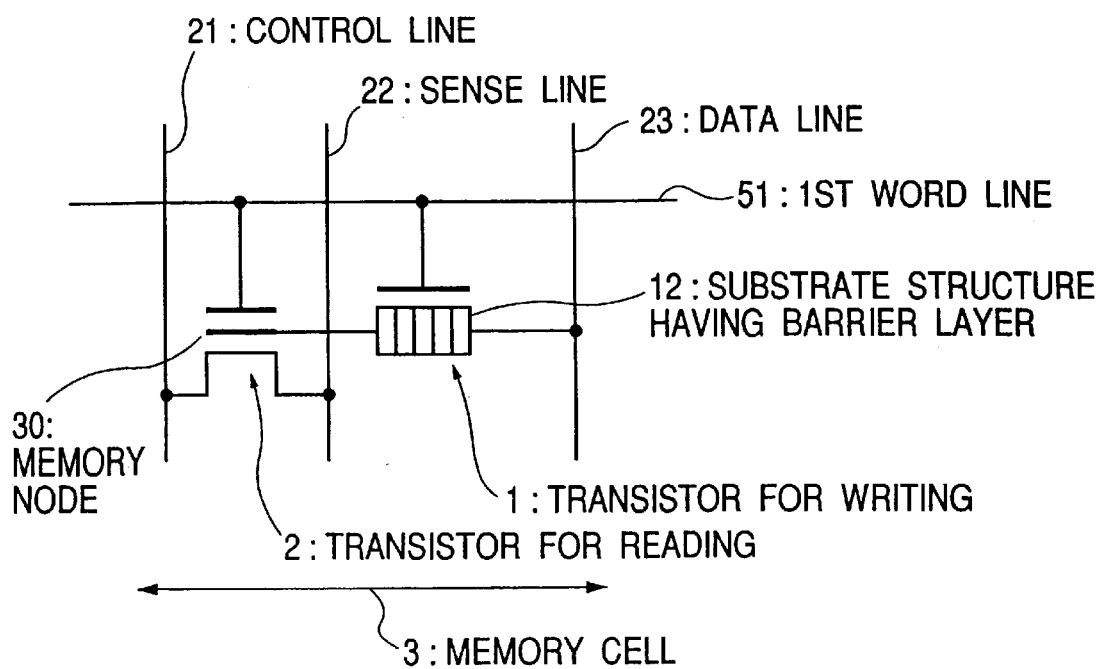
FIG. 29 is a circuit diagram of a fourth embodiment of the present invention.

FIG. 29 shows a circuit of a fourth embodiment of the present invention. In this embodiment, differently from the circuit having described with reference to FIG. 2 in which the first word line 51 and the second word line 52 are separately controlled, the first word line 51 and the second word line 52 are integrated into only the first word line 51. Such integration of the first and second word lines 51 and 52 becomes possible by suitably selecting the threshold voltages of the transistor 1 for writing and the transistor 2 for reading and the voltage applied to the first word line 51.

Figure 30:
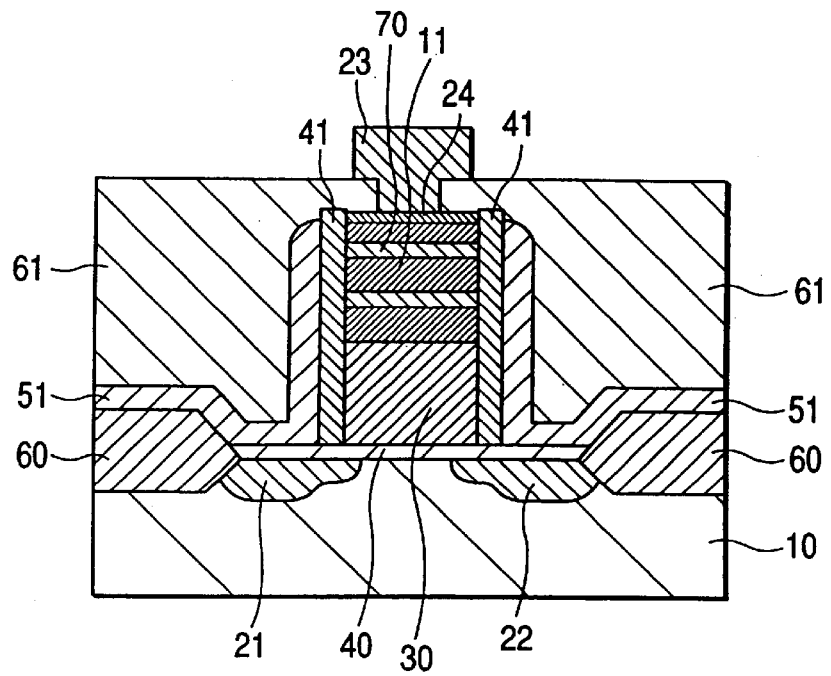
FIG. 30 is a sectional view of the fourth embodiment of the present invention.

FIG. 30 shows a memory cell structure of the fourth embodiment. The memory cell structure in the fourth embodiment can be made simpler and finer in structure and also simpler in manufacture than each of the first, second and third embodiments.

Figure 31:
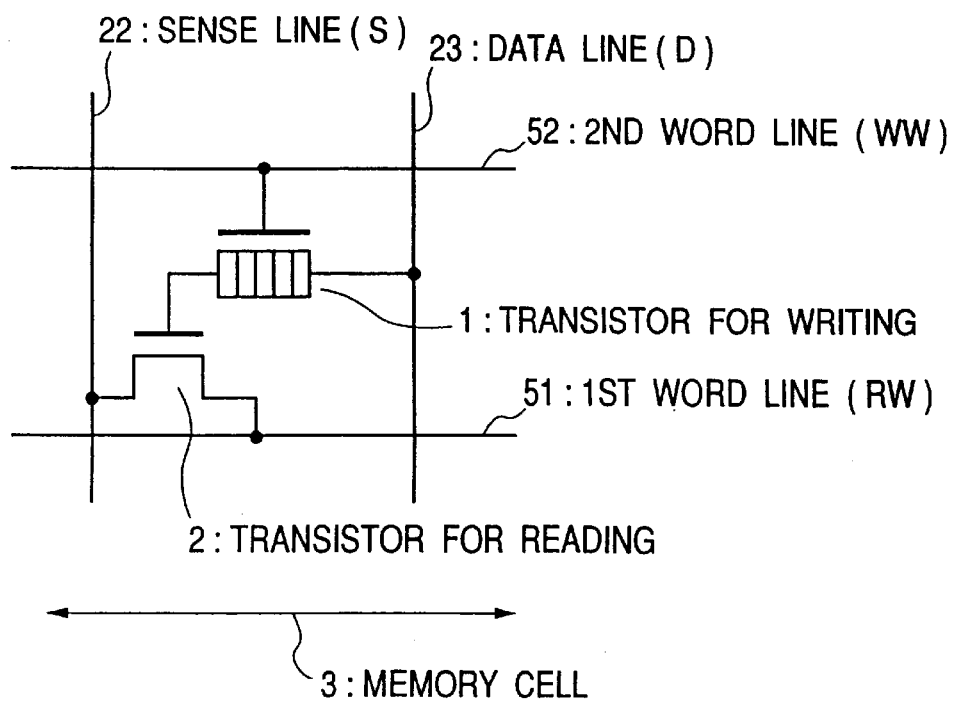
FIG. 31 is a diagram showing a memory cell circuit of a fifth embodiment of the present invention.

FIG. 31 shows the circuit of a fifth embodiment of the present invention.

Figure 32:
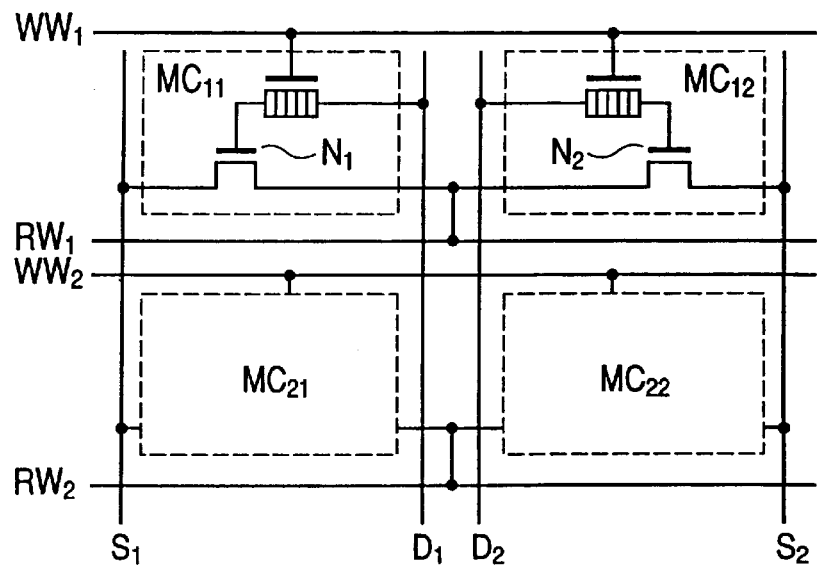
FIG. 32 is a diagram showing a memory cell circuit of the fifth embodiment of the present invention.
Figure 33:
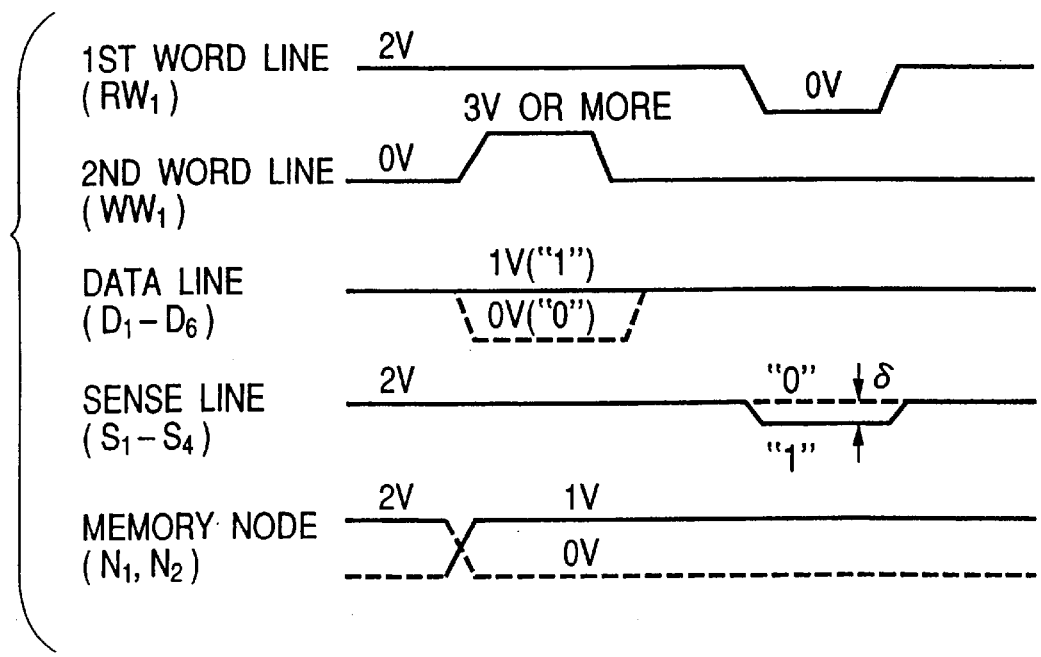
FIG. 33 is a diagram illustrating a circuit operation of the memory cell of the fifth embodiment of the present invention.

FIG. 32 is a memory array circuit of the fifth embodiment.

Figure 34:
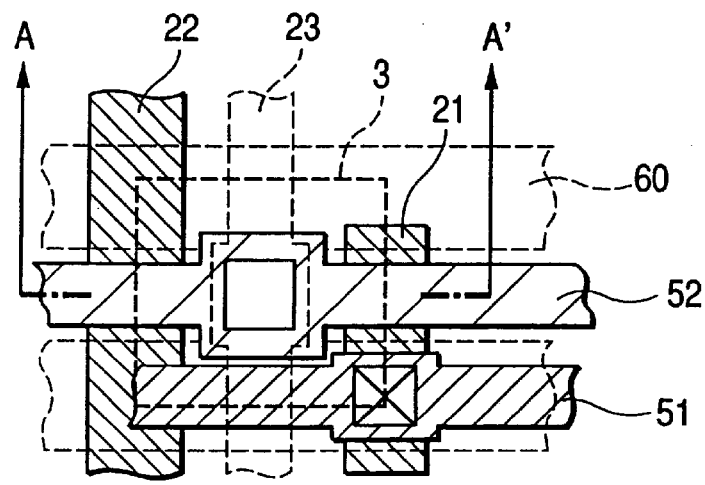
FIG. 34 is a plan view of a memory cell of the fifth embodiment of the present invention.

FIG. 34 is a timing chart showing the operation of the fifth embodiment. The structure of this embodiment is easy to be manufactured because a step-up capacitor and a word line for driving it are omitted. In this embodiment, the control line used in the previous embodiments is re-arranged in parallel to the word line, which control line is taken as a first word line. Here, the operation will be described in a condition that only the threshold voltage of the transistor for reading is changed into 0.5 V. The information is written as "1 V" or "0 V" in a memory node by the writing operation. The reading operation for each of the memory cells $MC_{11}$, and $MC_{12}$ is performed by setting the voltage of the first word line ($RW_1$) at 0 V. If the voltage of the memory node is 1 V, the transistor for reading is made conductive, while if it is 0 V, the transistor for reading is made non-conductive, and accordingly, like the previous embodiments, it can be discriminated whether the information is "1" or "0". It is to be noted that the transistors for reading in the memory cells $MC_{21}$ and $MC_{22}$, which are made non-conductor, do not exert adverse effect on the reading operation of the memory cells $MC_{11}$ and $MC_{12}$.

Figure 35:
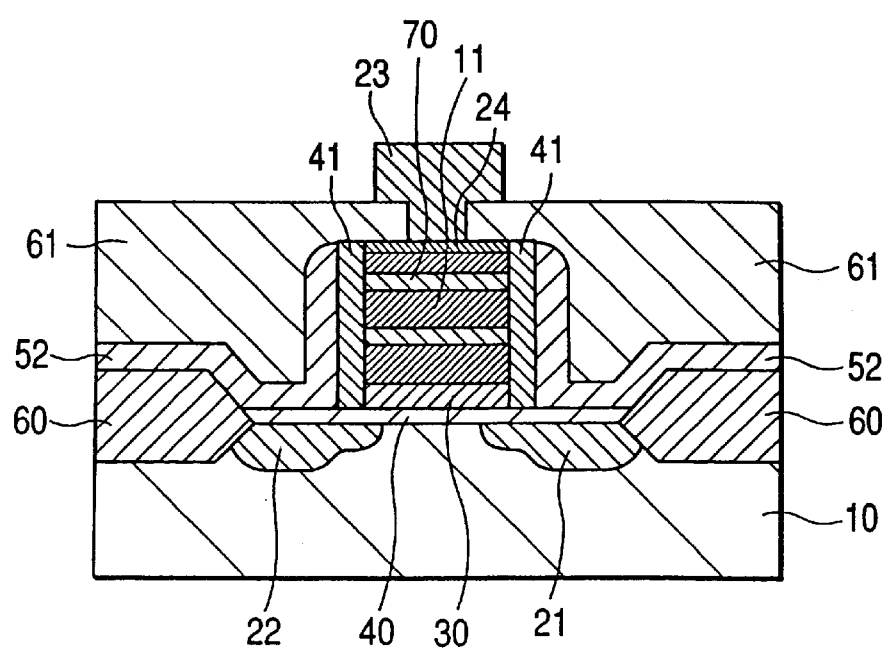
FIG. 35 is a sectional view of the memory cell of the fifth embodiment of the present invention.

FIG. 34 is a plan view of the memory cell of the fifth embodiment of the present invention, and FIG. 35 is a sectional view taken on line A–A' of FIG. 34.

As described above, the description of the previous embodiments of the present invention is limited to the memory cell and a memory array composed of the memory cells. However, the actual memory further includes direct peripheral circuits directly connected to the array, such as a sense amplifier and a decoder; and indirect peripheral circuits for achieving functions as the memory, such as a logic circuit and an input/output circuit. To suppress a subthreshold current, the gate length of a memory array is generally set longer than that of a direct peripheral circuit.

In the embodiments of the present invention, with respect to a direct peripheral circuit and an indirect peripheral circuit, if the source/drain of the transistor, for example, shown in FIG. 14, are directly used for the diffusion layer wirings, mask alignment is required because the memory node 30 as the gate is formed later, so that the transistor performance is generally degraded. Accordingly, as shown in FIG. 21, it is advantageous to use the source/drain (expressed by the control line 21 and the sense line 22 in FIG. 21) formed in self-alignment in the memory node 30.

However, in general, these lines are formed separately from the memory array for the reason of increasing the degree of freedom, thereby easily attaining a desired performance. The method of forming these lines is performed by adopting a general self-alignment silicon gate structure or LDD (Lightly Doped Drain) structure in which the concentration of an impurity near the source/drain is lowered. The present invention does not specify such a method of forming the transistor.

As described above, the present invention provides a memory having a characteristic of the usual RAM in combination with a characteristic of the usual nonvolatile memory. That is to say, there can be realized a memory exhibiting an information storing operation similar to that of the usual nonvolatile memory in combination with an amplifying function of a memory cell similar to that of the usual SRAM. In other words, the effect of the present invention is to provide a so-called "nonvolatile RAM" having a good long-term memory holding characteristic in combination with a stable and high speed RAM operation.

What is claimed is:

1. A memory device comprising:

a substrate;

a memory node overlying the substrate for capacitatively storing a level of electrical charge;

an insulating layer between the memory node and the substrate, electrically isolating the memory node from the substrate so that no significant leakage current flows between the memory node and the substrate; and a controllable conduction device comprising a charge carrier path coupled to the memory node for changing the level of charge held by the memory node, and a gate for switching the conductivity of the path between conductive and non-conductive conditions to change the level of charge stored by the memory node, wherein the controllable conduction device overlies the memory node.

2. The device of claim 1 wherein the controllable conduction device, when viewed from above the substrate, at least partially overlaps the memory node.

3. The device of claim 1 wherein the controllable conduction device, when viewed from above the substrate, overlaps the memory node entirely.

4. The device of claim 1 wherein the controllable conduction device comprises a vertical transistor overlying the memory node.

5. The device of claim 1 wherein the gate of the controllable conduction device comprises a side gate.

6. The device of claim 5 including an insulating region that electrically insulates the side gate from the charge carrier path.

7. The device of claim 1 wherein the memory node is made of silicon.

8. The device of claim 1 wherein the substrate comprises a semiconductor material doped to be of a particular conductivity type, and the insulating layer comprises a compound that includes the material of the substrate.

9. The device of claim 8 wherein the substrate is formed of silicon and the insulating layer comprises silicon oxide.

10. The device of claim 1 wherein the controllable conduction device includes a barrier structure for controlling conduction along the charge carrier path.

11. The device of claim 1 wherein the charge carrier path of the controllable conduction device comprises a region of polysilicon.

12. The device of claim 1 including an electrode to the charge carrier path to act as a source for charge carriers to be stored on the memory node.

13. A memory device including a substrate and an array of memory cells on the substrate, each of the cells comprising:
a memory node overlying the substrate for capacitatively storing a level of electrical charge;
an insulating layer between the memory node and the substrate, electrically isolating the memory node from the substrate so that no significant leakage current flows between the memory node and the substrate; and
a controllable conduction device comprising a charge carrier path coupled to the memory node for changing the level of charge held by the memory node, and a gate for switching the conductivity of the path between conductive and non-conductive conditions to change the level of charge stored by the memory node, wherein the controllable conduction device overlies the memory node.

14. The device of claim 13 including addressing circuitry configured to write charge onto the memory node of each of the cells selectively.

15. The device of claim 13 wherein the controllable conduction device, when viewed from above the substrate, at least partially overlaps the memory node.

16. The device of claim 13 wherein the controllable conduction device, when viewed from above the substrate, overlaps the memory node entirely.

17. The device of claim 13 wherein the controllable conduction device for each cell comprises a vertical transistor overlying the memory node.

18. A method of fabricating a memory device on a substrate comprising:
forming a memory node overlying the substrate for capacitatively storing a level of electrical charge;
providing an insulating layer between the memory node and the substrate, configured so that in use of the memory device no significant leakage current flows between the memory node and the substrate; and
fabricating a controllable conduction device comprising a charge carrier path coupled to the memory node for changing the level of charge held by the memory node, and a gate for switching the conductivity of the path between conductive and non-conductive conditions to change the level of charge stored by the memory node, the controllable conduction device being fabricated in a configuration that overlies the memory node.

19. The method of claim 18 wherein the substrate is formed of silicon and including oxidising the substrate to form said insulating layer.

20. The method of claim 18 including growing the insulating layer to a sufficient thickness in use of the memory device no significant leakage current flows between the memory node and the substrate.

21. The method of claim 18 including configuring the controllable conduction device so that it at least partially overlaps the memory node when viewed from above the substrate.

22. The method of claim 18 including configuring the controllable conduction device so that it overlaps the memory node entirely, when viewed from above the substrate.

23. The method of claim 18 including forming said controlled conduction device as a vertical transistor overlying the memory node.

24. A memory device comprising:
a substrate;
a memory node overlying the substrate for capacitatively storing a level of electrical charge;
an insulating layer between the memory node and the substrate, electrically isolating the memory node from the substrate so that no significant leakage current flows between the memory node and the substrate; and
a vertical transistor overlying the memory node, the vertical transistor having an upper contact and a vertical charge carrier path coupled between the upper contact and the memory node for changing the level of charge held by the memory node, and a gate electrically insulated from the vertical charge carrier path for switching the conductivity there of between conductive and non-conductive conditions to change the level of charge stored by the memory node.

25. A memory device comprising:
a substrate,
an electrically insulating layer on the substrate,
a first vertical transistor structure comprising source, barrier and drain regions formed in an overlying configuration upstanding from the insulating layer, and a side gate formed on the upstanding configuration, the barrier region being formed of material which provides an internal electrostatic barrier potential of a relatively high barrier height to inhibit charge carrier flow along the path between the source and drain regions, the barrier height being selectively lowerable in response to an external bias being applied to the gate so that charge carriers can pass along the path between the source and drain regions,
a memory node coupled to the first vertical transistor structure, and
a second transistor coupled to the memory node,
said first and second transistors overlying one another.

26. The memory device of claim 25 wherein the second transistor is a horizontal transistor.

27. The memory device of claim 25 wherein the second transistor is underneath the first transistor.

28. The memory device of claim 25 wherein the memory node is made of silicon.

29. The memory device of claim 25 wherein the substrate comprises a semiconductor material doped to be of a particular conductivity type, and the insulating layer comprises an oxide of the material of the substrate.

30. The memory device of claim 25 wherein the substrate is formed of silicon and the insulating layer comprises an oxide of silicon.

31. The memory device of claim 25 wherein the charge carrier path of the first transistor comprises a region of polysilicon.

32. A memory device including a substrate and an array of memory cells on the substrate, each of the cells comprising:
- a first vertical transistor structure comprising source, barrier and drain regions formed in an overlying configuration upstanding from the insulating layer, and a side gate formed on the upstanding configuration, the barrier region being formed of material which provides an internal electrostatic barrier potential of a relatively high barrier height to inhibit charge carrier flow along the path between the source and drain regions, the barrier height being selectively lowerable in response to an external bias being applied to the gate so that charge carriers can pass along the path between the source and drain regions,
- a memory node coupled to the first vertical transistor structure, and
- a second transistor coupled to the memory node,
- said first and second transistors overlying one another.

33. The memory device of claim 32 including addressing circuitry configured to write charge onto the memory node of each of the cells selectively.

34. A method of fabricating a memory device comprising:
- providing a substrate,
- forming an electrically insulating layer on the substrate,
- fabricating a first vertical transistor structure comprising source, barrier and drain regions in an overlying configuration upstanding from the insulating layer, and a side gate on the upstanding configuration, the barrier region being formed of material which provides an internal electrostatic barrier potential of a relatively high barrier height to inhibit charge carrier flow along the path between the source and drain regions, the barrier height being selectively lowerable in response to an external bias being applied to the gate so that charge carriers can pass along the path between the source and drain regions,
- providing a memory node coupled to the first vertical transistor structure, and
- fabricating a second transistor coupled to the memory node such that said first and second transistors overlie one another.

35. The method of claim 34 including fabricating a plurality of memory cells on the substrate, each of the cells respectively comprising said first and second transistors and said memory node.

* * * * *